United States Patent [19]
Mimoto et al.

[11] Patent Number: 5,929,469
[45] Date of Patent: Jul. 27, 1999

[54] CONTACT HOLES OF A DIFFERENT PITCH IN AN APPLICATION SPECIFIC INTEGRATED CIRCUIT

[75] Inventors: Kenichiro Mimoto; Motohiro Enkaku; Takehiko Hojo, all of Kanagawa-ken, Japan

[73] Assignee: Kabushiki Kaisha Toshiba, Kawasaki, Japan

[21] Appl. No.: 08/992,542

[22] Filed: Dec. 17, 1997

[30] Foreign Application Priority Data

Dec. 25, 1996 [JP] Japan .................................. 8-345720

[51] Int. Cl.⁶ ............................................... H01L 27/118
[52] U.S. Cl. ........................... 257/208; 257/211; 257/207
[58] Field of Search .................... 257/211, 208, 257/207, 206

[56] References Cited

U.S. PATENT DOCUMENTS

| | | | |
|---|---|---|---|
| 5,397,906 | 3/1995 | Kumagai | 257/207 |
| 5,436,485 | 7/1995 | Shikatani et al. | 257/207 |
| 5,777,369 | 7/1998 | Lin et al. | 257/368 |

*Primary Examiner*—David B. Hardy
*Attorney, Agent, or Firm*—Foley & Lardner

[57] ABSTRACT

In a first inter-layer insulator film above source/drain regions of basic cells constituting a gate array, first contact holes (joint contacts) are placed, so that wings (joint plates) electrically connected with the source/drain regions via plugs in those joint contacts is locally placed above the source/drain regions. Above the wings is formed a second inter-layer insulator film, above which is formed a first level interconnection which constitutes one of metal wiring layers. In the second inter-layer insulator film are formed second contact holes, so that a semi-custom ASIC is provided in which the wings and the first level interconnection are electrically interconnected via the plugs in those second contact holes. The first and second contact holes, first level interconnection, etc. are automatically designed by use of a computer based on a grid pattern in the basic cells. According to the present invention, the basic cells need not be re-designed even if a first pitch of a pattern of the first contact holes is different from a second pitch of a pattern of the second contact holes, thus easily enabling automatic customization. Without increasing the area of the source/drain regions in the basic cells, any pitch of the wiring layers can be selected, thus increasing the integration density without deteriorating the performance of MOS FETs at the same time as reducing time required for the customization.

15 Claims, 17 Drawing Sheets

CONTACT HOLES OF A DIFFERENT PITCH IN AN APPLICATION SPECIFIC INTEGRATED CIRCUIT

BACKGROUND OF THE INVENTION

1. Field of the Invention

The present invention relates to wiring technologies for MOS LSIs and other semiconductor integrated circuits. The present invention more specifically relates to technologies of improving the integration density by changing the routing pitch of metal wiring layers to be connected to the sources and/or drains of MOS FETs that constitute basic cells in the customization of application specific integrated circuits (ASICs) and other semi-custom ICs.

2. Description of the Prior Art

While the full-custom IC fabrication methodology is suited to the mass-production of high-performance ICs, the semi-custom IC fabrication methodology represented by that of ASICs is suited to the speedy development of user-specific LSIs by computer-based automatic design based on logical cells prepared so as to comprise the functions of each level of SSIs, MSIs, and LSIs. Although full-custom design methodology employs computer-based automatic design, it applies automation mainly to the forecasting of circuit behavior and the verification of patterns. Moreover, it has standards in automatic design in the other fields, so that the designer must interact with the computer in designing of ICs.

The semi-custom design methodology, on the other hand, may be said to be provided with automatic design standards by use of computers. Gate arrays used in designing of an ASIC feature that identical basic cells such as shown in FIGS. 1A and 1B are partitioned and placed on a grid-shaped master chips 81 and 82 such as shown in FIGS. 2A and 2B, respectively. Then, the designer only has to customize the final contacts and metal wiring layers to be formed above the basic cells and conduct only wiring connection of those metal wiring layers as shown in FIGS. 3A and 3B, to complete a user-specific LSI.

The reasons why gate arrays can be developed in a short period of time are:

a) The fabrication processes are conducted only to last few steps of metal wiring layers;

b) Time is rather short that is required for (preparation of) packaging and evaluation because the chip size and the number of pads are known beforehand; and c) Verification of functions does not take a long time with lesser mistakes and troubles because logics can be easily verified on the basis of pre-verified cells and automatic design (AD) of a target LSI.

FIG. 2A shows an example of gate-array chip configuration. In FIG. 2A, basic cells 61 are disposed in a row on a chip 81, between which are arranged horizontal wiring channel regions 63. In another example shown in FIG. 2B, basic cells are arranged in islands, between which wiring horizontal channel regions 65 and vertical wiring channel regions 66 are disposed. Both how to arrange the basic cells 61 and how to set the horizontal wiring channel regions 63 and 65 and vertical wiring channel regions 66 depend on the process technologies used, the construction of the basic cells 61, and the easiness of creating automatic arrangement/wiring programs. Each of the chips 81 and 82 has I/O cells on its periphery, each terminal of which comprises input buffers, output buffers, and bilateral buffers, depending on the wiring mask. The I/O cell 62 further has a bonding pad 71 on its periphery, which is connected to a package pin with a bonding wire made of gold etc.

By customizing metal wirings on such basic cells 61, each having a uniform mask pattern as shown in FIG. 1A or 1B, desired logical gates such as NOT, NAND, or NOR can be produced. Also, by customizing metal wiring on the wiring regions between those basic cells, the logical gates can be connected to each other. For example, as shown in FIGS. 3A and 3B, by routing metal wiring consisting of a lateral first level interconnection 6 (the deepest level metal wiring layers) and a second level interconnection 7 formed vertically via the overlying insulator film, a NAND circuit having two inputs can be configured.

Thus, for ASICs, by designing only a pattern of metal wiring layers consisting of such first level interconnection 6 and second level interconnection 7 as shown in FIGS. 3A and 3B above those basic cells 61 designed and registered beforehand, any connections can be produced. As a wiring channel region between cell rows, a first level interconnection 6 is used as a lateral (perpendicular to a gate polysilicon 1) metal wiring and an overlying second level interconnection 7, as a vertical (parallel to the gate polysilicon 1) metal wiring. As shown in FIG. 3B, however, part of the first level interconnection 6 parallel to the gate polysilicon is also designed. The lateral first level interconnection 6 and the vertical second level interconnection 7 are not electrically connected because they are on different levels mutually and insulated from each other with an insulator film, although they may be overlapped in a plan view of mask pattern. To electrically connect $n^+$ source/drain regions 12 and $p^+$ source/drain regions 22 in the basic cell 61 to the first level interconnection 6, it is necessary to use contact windows (contact holes) 3 and 74 in an inter-layer insulator film.

In design of ASICs, it is usual to design and register beforehand as a cell library in the computer such patterns as $n^+$ source/drain regions 12, $p^+$ source/drain regions 22, and gate polysilicon 1 of basic cell 61 of logical gates such as NAND, NOR, and NOT of an gate array. Also, even a large logical block can be realized by using a plurality of basic cells. Flip-flops and other basic composite gates are also designed and register in the computer beforehand. Each of those utilizes a plurality of basic cells, so that it is called a macro cell.

In a gate array, circuits each of which has the same number of gates can share the same basic-cell layer below a metal wiring layer. After logical design of a logical circuit is finished, layout design only has to be conducted on a metal wiring layer, to realize a desired circuit. By prefabricating the basic-cell parts other than the metal wiring layer, which is the top part of the chip, it is possible to reduce the costs of integrated circuits. In this sense, such type of ICs are used widely as semi-custom ICs.

The metal wiring usually is designed along a grid 90 such as shown in FIG. 1B. Each of the grids 90 has a prescribed pitch. And each of its intersections is prepared so that a square-shaped contact hole can be disposed according to a specification. FIG. 1B shows a basic cell that has two $p^+$ regions 22 inside an n-well 9 and another two $n^+$ regions 12 on a p-type substrate outside the n-well 9. Each of those $n^+$ regions 12 and $p^+$ regions 22 has therein two gate polysilicon 1 even spaced. In FIG. 1B, although intersection of the grid 90 and the gate polysilicon 1 are not overlapped, in an actual pattern, the gate polysilicon 1 has also an intersection placed thereon, so that it has a contact hole opened at prescribed positions of its self. A gate array circuit comprises a horizontal and a vertical arrays of such basic cells as shown in FIG. 1B disposed on such chips 81 as shown in FIGS. 2A and 2B. Then, first and second level interconnections are arranged along the grids, thus enabling automatic design.

FIGS. 3A and 3B respectively show first level interconnection 6 and second level interconnection 7 for two-input NAND circuits and another two-input AND circuits designed by an ASIC methodology. In FIG. 3A, a thin line 6 represents the first level interconnections, a bold line 7 represents the second level interconnections, and a solid circle represents contact holes 3, 74 and via hole 77 which constitute a two-input NAND circuit. The via hole 77 contacts exclusively between the first and second level interconnections. FIG. 3B is a plan view more specifically illustrating a two-input AND circuit, which comprises first level interconnections, second level interconnections 7, contact holes 3, 74, and 76, and via holes 77. Between the first and the second level interconnections is formed an interlayer insulator film to isolate them from each other, being connected with them through via holes at prescribed positions. The first level interconnection is connected to the gate polysilicon 1 via the contact holes 76 and to the $n^+$ source/drain regions 12 via the contact holes 3 and also to the $p^+$ source/drain regions via the contact holes 74. FIGS. 4A and 4B show part of a plane pattern of conventional ASIC-MOS LSIs. FIG. 5A is a cross sectional view cut along the I—I line of FIG. 4A, while FIG. 5B is a cross section view cut along II—II line of FIG. 4A. By the conventional technology, as shown in the cross sectional view of FIG. 5A, on a channel region between the source region 12 and the drain region 12 is placed the gate polysilicon 1 via a gate oxide film, thus constituting an MOS transistor. Apart from the edge of the gate polysilicon by "a prescribed distance a" determined by the design rules (i.e., a margin for mask alignment), a contact hole 3 is opened to electrically interconnect the first level interconnection 6 and the source/drain regions of the MOS transistor. Also, the width of the gate polysilicon 1, that of the contact hole 3, and the distance between these determine a pitch for the grid 90, which also depend on the geometrical configuration of MOS transistors shown in FIG. 1B. As shown in FIG. 5B also, apart from the edge of the source/drain regions 12 by "a distance c" as a mask-alignment margin, contact holes 3 are opened.

FIG. 6A shows a partial plan view of the semiconductor integrated circuit composed of conventional LDD-MOS FETs, while FIG. 6B shows a cross sectional view of the circuit cut along the III—III line of FIG. 6A. By the LDD-MOST FET structure, it is necessary to form, as shown in FIG. 6B, contact holes 3 having low ohmic contact resistance to deep high-impurity concentration $n^+$ source/drain regions 12. And "the distance e" between a gate polysilicon 1 and contact holes 3 is wider than that of the normal MOS FET structure. In the fabrication of ASICs, several tens to several hundreds of types of master chips are prefabricated corresponding to the kinds of gates (the number of transistors used), so that appropriate master chips can be selected corresponding to the scale of a desired LSI. To realize desired functions on thus selected master chips, basic cells are (automatically) disposed in consideration of the connection relationship between the cells. Then, a task of automatic inter-cell routing is conducted over the grids 90 as shown in FIG. 1B. The wiring channel regions of gate arrays are fixed as shown in FIGS. 2A and 2B. The channel routing is executed between device rows of logical cells by use of a wiring tool. Next, those signals not wired yet undergo routing by use of for example a maze running router. Any gates, if wired yet, is wired on the basis of interactive processing with the designer. In this case, also, in contrast to manual routing by the conventional full-custom design method, a method by the present invention generally only has to conduct routing in the database of computer which stores inter-cell connection information and the design rules, giving no mistakes in connection or design rules. Moreover, interactive routing, even if needed, should preferably be conducted without changing the contents of the database about the position, pitch, geometry of the grids, contact holes, first wiring layer 6, and second wiring layer 7 in the basic cells.

Any large-scale circuit system will almost in all cases comprises memories, CPU cores, ALUs, A/D and D/A converters, displays, and various I/O circuits, etc. If one chip intends to have a large scale of circuits, those sub-systems must naturally be integrated in one chip. This leads to the necessity of the hybridization of memories and logics as well as that of analog circuits and digital circuits. The hybridization of memories and logics has a problem of harmony between the pitch of memory bit lines and word lines and that of logics. Moreover, even when the same type of circuits are to be integrated in the same chip, there occurs a case that a part of the circuits is required to increase locally in integration density. In such a case that the hybridization is necessary or a part of integration density have to be changed, a wiring layer pitch (pitch 2) different from that for the basic cells (pitch 1) stored in a cell library may be necessitated.

The details of these problems are discussed below with reference to FIGS. 4A and 4B.

(a) FIG. 4B shows a case where the position of a first level interconnection 6 of the metal wirings for an LSI pattern designed according to the user's desired specifications does not match a first pitch (pitch 1) of contact holes 3 of a basic cell registered in a cell library. As already explained, the first level interconnection is supposed to be, as shown in FIG. 1B, formed along grids 90 and the contact holes are disposed, at the intersections of the grids 90 in the gate array architecture. Then, in this case, the first level interconnection 6 arranged along a second pitch (pitch 2) cannot be connected to source/drain regions 12 unless the pitch 1 is widened to move the contact holes 3 to the next intersection of the grids. If the pitch 1 is widened to a pitch 2, a "mask alignment margin c" cannot be assured which is, as shown in the cross sectional view of FIG. 5B, a distance from the edge of the source/drain region 12 to the right end of the contact hole 3, or the contact hole 3 would get out of the source/drain region 12. In order not to cause the contact hole 3 to do so, the source/drain regions 12 must be widened, by changing the basic cell patterns, which require time consuming pre-stage fabrication steps such as ion implantation steps and lose the advantages of gate array design methodology. Further, thus widened source/drain regions 12 increase parasitic resistance (source resistance and/or drain resistance) which is determined by the resistivity in the source and the drain regions as well as junction capacitance associated with the increased area of the source/drain regions, thus deteriorating the high-speed, high-frequency performances and noise characteristics.

(b) To match the first pitch (pitch 1) with a wider second pitch (pitch 2) means that the pitch for basic cell's gate polysilicon 1 cannot be narrowed, which inhibits the increase of degree of integration density in semiconductor ICs.

(c) In the fabrication of ASICs, contact holes are produced by automatic design, wherein square or rectangular patterns having a prescribed area are arranged at the intersections of the grids as shown in FIG. 1B. In this case, however, if the number of contact holes (or the number of grid intersections)

connecting the first level interconnection 6 and the source/ drain regions 12 is fixed, the contact resistance cannot be decreased below a certain lower limit. This problem is significant in a large transistor having a wide width W of the source-drain regions (channel width W such as shown in FIG. 4A), in such large transistor the increase of diffusion resistance along the channel width direction will deteriorate seriously the high-frequency performances.

SUMMARY OF THE INVENTION

In consideration of those problems, an object of the the present invention is to provide a design method of enabling rapid and automatic layout of LSI patterns without changing the database of the first level interconnection's pitch, the database of source/drain region patterns in basic cells and the pitch for contact holes arranged as against those source/ drain regions, etc.

Another object of the present invention is to provide a semiconductor integrated circuit by use of this design method. More specifically, the object of the present invention is to provide such application specific integrated circuits (ASICs) that it is possible to narrow a first pitch (pitch 1) of patterns below the gate polysilicon layer constituting basic cells without being effected by second pitch (pitch 2) of the first level interconnection constituting metal wirings in the ASICs.

A further object of the present invention is to provide such ASICs that it is possible to narrow the second pitch (pitch 2) of the first level interconnection independently of the first pitch (pitch 1) of the basic cells.

An additional important object of the present invention is to provide such ASICs that the source/drain region need not be increased in area while keeping large the margin between the contact holes and the source/drain regions. That is, the additional important object is to provide such wiring technology for ASICs that it is possible to improve the integration density with easier design and fabrication methods without increasing parasitic resistance or capacitance caused by increased areas of the source/drain regions.

A further significant object of the present invention is to enable designing ASICs based on, mutually independently, a first design rule using as parameters the MOS FET gate length of basic cells and a second design rule using as parameters the wiring width of metal wiring layers. That is, it is to provide a wiring technology for ASICs to enable higher integration densities by realizing a harmonized first design rule for MOS FETs having an extremely short gate length less than 0.025 or 0.02 micrometer, where the second design rule for metal wiring layers prohibits such small line width, because the resistance of such small line width becomes extremely high due to the metal resistivity.

To this aim, a first feature of the present invention is a semiconductor ASIC wherein a first pitch (pitch 1) of first contact holes (joint contacts) exposing a surface of at least one of source and drain regions of MOS FETs constituting basic cells of the gate array is different from second pitch (pitch 2) of upward second contact holes in direct contact with a first level interconnection, i.e. the deepest wiring layer in the case of multi-level metal wirings, formed to customize the gate array's basic cells. "The first pitch (pitch 1)" and "the second pitch (pitch 2)" refer to a pitch as measured in a longitudinal direction of a gate electrode 1 sandwiched between the gate electrodes 1 of basic cells as shown in FIG. 7A. The pitch 1 may be either smaller than the pitch 2 as shown in FIG. 7A or larger than that as shown in FIGS. 12A and 12B.

That is, according to the first feature of the present invention, it is possible to select the second pitch (the pitch 2) for the first level interconnection independently of the first pitch (the pitch 1) pre-selected as basic cell patterns. With this, it is possible to prevent redesigning of source/ drain regions in those basic cells as well as accompanied increases in unnecessary area, at the same time as increasing the integration density of ASICs. Also, the first feature of the present invention can realize a wide variety of user demands without changing the contents of the database of basic cells and metal wiring layers. The first feature, in particular, eliminates the necessity of re-design of MOS FET's source/ drain regions and the accompanied increases in the area of those regions, thus having a merit of being able to fix the patterns of gate array's basic cells. Moreover, the first feature enables it to easily increase the number of contact holes and their total area, thus preventing increases in diffusion resistance as measured in a longitudinal direction of the MOS FET based on a resistivity in the source and drain regions, to improve the performance of large-gate width MOS FETs. By the first feature, along with a merit of inhibiting increases in parasitic capacitance (junction capacitance) caused by increases in the area of the source/ drain regions, it is possible to realize higher integration densities, lower power consumption, and higher operation speed of ASICs simultaneously. In some cases, moreover, only desired source/drain regions of MOS FETs in a certain area on the chip can be shrinked relatively.

A second feature of the present invention is a semiconductor IC that comprises at least: a first semiconductor region which acts as a channel region; second-conductivity type source and drain regions formed partially above the first semiconductor region; gate electrodes made of polysilicon, refractory metal, its silicide, or the composite films; a first inter-layer insulator film composed of first inter-layer insulator films made of $SiO_2$ film, PSG film, or BPSG film or the composite film formed above the gate electrodes, drain, and source regions; first contact holes (joint contacts) opened in the first inter-layer insulator film on the source and drain regions respectively; first plugs made of high-conductivity materials such as polysilicon, refractory metal, its silicide, or the composite films embedded in the first contact holes; wings made of polysilicon films or metal films, electrically connected to the first plug; second inter-layer insulator film made of $SiO_2$ film, PSG film, BPSG film, $Si_3N_4$ film, or the composite film formed above the wings or the first interlayer insulator film where the wings are not formed; and second contact holes formed in the second inter-layer insulator film above the at least one of wings. Preferably, into the second contact holes are embedded the second plugs made of polysilicon, refractory metal, its silicide, the composite film, or other high-conductivity materials, through which are connected metal films made of Al, Al—Si, Al—Cu—Si, W, Ti, etc., silicide films of $WSi_2$, $MoSi_2$, or other refractory metal, polysilicon films, or the composite films. In the case of a multi-level construction of metal wiring layers, "metal wiring layer" refers to the first level interconnection. Also, "the wing" refers to a joint plate having a geometry of plane patterns locally disposed only above specific areas such as shown in FIG. 9. FIG. 9 is a plan view illustrating a basic cell which comprises: an n-well 9 formed in a p-type substrate; $p^+$ regions 22 which act as source/drain regions of a pMOS FET in the n-well 9; $n^+$ type regions 12 which act as source/drain regions of nMOS FET formed in the p-type substrate; and overlying gate electrodes 1. As shown in FIG. 9, "the wings 4" are locally placed above and the vicinity of the source/drain regions 12 and 22, respectively. And the wing above one of the source/drain regions does not extends over the adjacent source/drain region. In this sense, the wings of the present invention clearly differentiate from "the metal wirings to customize the conventional gate arrays".

More preferably, a distance (mask-alignment margin) between the edge of the gate electrodes and that of the fist contact holes is larger than a distance (mask-alignment margin) between the edge of the gate electrodes and that of the second contact holes. Thus provided configuration would make the integration density of wiring layers higher than a pitch of the basic cells. By the second feature of the present invention, a mask-alignment margin between the source/drain region's edge and the first contact hole's edge may be larger than that between the source/drain region's edge and the second contact hole's edge.

By the second feature of the present invention, even if a pitch of a wiring layer to customize the gate array is different from that of the underlying pattern of basic cells, it is not necessary to enlarge the area of the source/drain regions by re-designing them. That is, a certain mask-alignment margin can be secured at the same time as increasing the integration density, even without changing the patterns of prefabricated gate array basic cells.

By the second feature of the present invention, moreover, by adding joint contacts (second contact holes) and wings between the source/drain regions and the first level interconnection on the basic cells of the gate array, it is possible to automatically design the number of joint contacts to be in connection with the source/drain regions of MOS FETs without changing the contents of the database of the grids and their intersections, i.e. contact holes. With this, the total area of the contact holes becomes larger than the conventional ASIC, so that it is possible to decrease the contact resistance and diffusion resistance (parasitic resistance between the source and drain regions). This leads to the improvement of the frequency performances, power consumption, noise characteristics, and other behaviors of the ASICs.

A third feature of the present invention is a method of designing ASIC patterns to customize metal wiring layers above a prescribed basic cell pattern, wherein gate array patterns can be designed under such conditions that a first pitch (a pitch 1) of grids to dispose the patterns of first contact holes formed in this basic cell is different from a second pitch (a pitch 2) of grids to dispose the patterns of second contact holes directly under the metal wiring layer. In the case of a multi-level structure, here, "the metal wiring layer" refers to the first level interconnection.

Preferably, in such a case, between the first and the second contact holes are provided the patterns of wings to be disposed within the range of basic cell. "Within the range of basic cell" refers to, as shown in FIG. 9, such a range where some entity overlaps with source/drain regions 12 and 22 respectively and gets out of them partially. In particular, the pitch 1 is preferably fixed while designing the patterns of the first level interconnection.

By the third feature of the present invention, the basic cell patterns need not be re-designed, enabling the database of basic cells to be fixed. Since the basic cell database can be fixed, the source/drain regions will not be increased in area. Therefore, high-integration density can be accomplished, thus enabling the easy and speedy customization, by use of a computer, of gate arrays having high-speed and low-power consumption performance.

A fourth feature of the present invention is a method of fabricating ASICs which comprises at least the steps of: prefabricating a basic cell part using a first mask pattern to form gate electrodes and a second mask pattern to form source/drain regions; forming first contact holes in the source/drain regions in a first inter-layer insulator film formed above the basic cell part, using a third mask pattern; electrically connecting the source/drain regions with wings by forming the joint plates only in the vicinity of the source/drain regions where those regions overlap with the first contact holes, using a fourth mask pattern; forming second contact holes where those holes overlap with wings in a second inter-layer insulator film, using a fifth mask pattern; and electrically connecting the wings and metal wiring layers by forming metal wiring layers using a sixth mask pattern. In the case of metal wiring layers of a multi-level structure, "metal wiring layer" refers to the first level interconnection of the structure.

According to the fourth feature of the present invention, it is possible to easily design the sixth mask pattern above the basic cells by preparing those with the first and the second mask patterns used as fixed mask patterns.

A fifth feature of the present invention is a method of fabricating ASICs by customizing metal wiring layers above prefabricated basic cells. The fifth feature comprises at least the steps of: prefabricating basic cells having a part including a first conductivity type of semiconductor region, a second conductivity type of source/drain region formed at part of the semiconductor region, a gate electrode formed via a gate insulator film above a semiconductor region between the source and drain regions, and a first inter-layer insulator film formed above the source/drain regions and the gate electrode; exposing part of the source/drain regions by opening first contact holes in the first inter-layer insulator film on the source/drain regions; forming first plugs by embedding a high-conductivity material into second contact holes; locally forming wings made of a high-conductivity material electrically connected to the first plugs in the vicinity of the source/drain regions; forming a second inter-layer insulator film above the wings and the first inter-layer insulator film; and exposing part of the wings by opening second contact holes in the second inter-layer insulator film above the wings. The fifth feature, after the sixth process, preferably comprises further steps of forming second plugs by embedding a high-conductivity material into the second contact holes and forming a first level interconnection made of a high-conductivity material electrically connected to the second plugs. "The first level interconnection" corresponds to the deepest level interconnection of multi-level metal wiring in the conventional ASICs.

According to the fifth feature of the present invention, only by preparing a master chip of gate arrays having prescribed basic cells, it is unnecessary to re-design the basic-cell part when customizing metal wiring layers, thus enabling speedy automatic design. Even when a pitch peculiar to the basic-cell part is different from that peculiar to the metal wiring layer in particular, the database need not be changed, thus enabling speedy development of ASICs.

The present invention, having the above-mentioned first through fifth feature, is effective in the development of those ASICs with improved fine patterning and higher integration densities. The reason is that the present invention can solve a problem of the present level of miniturization of LSIs that even if the gate length of MOS LSIs can become finer than an extreme of 0.25 to 0.02 micrometer, the line width of the metal wiring layer cannot be scaled, limited by the resistance of the wiring material. It is speculated that the line width of metal interconnection cannot be fined to less than 0.5 to 0.3 micrometer in the art. That is, by the present invention, it is possible to design the basic cells independently of the overlying metal wiring layer, thus enabling pattern design of gate arrays by releasing these line width limits. With this, the present invention can meet both a demand for improved transconductance gm and higher-speed operation of individual MOS FETs and a demand for smaller feature sizes, higher integration densities, speedy automatic design, and speedy delivery of ASICs.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 1A is a plan view illustrating one of basic cells of a gate array, while

FIG. 4A is a plan view of a basic cell of the conventional ASIC, while

FIG. 5A is a fragmentary cross sectional view cut along the I—I line of FIG. 4A, while

FIG. 6A is a plan view of another ASIC basic cell, while

FIG. 11A is a plan view of an ASIC basic cell related to a second embodiment of the present invention, while FIG. 12A is a plan view of an ASIC basic cell related to a third embodiment of the present invention, while

DETAILED DESCRIPTION OF THE EMBODIMENTS

Various embodiments of the present invention will be described with reference to the accompanying drawings. It is to be noted that the same or similar parts and elements throughout the drawings, and the description of the same or similar parts and elements will be omitted or simplified. Generally and is it is conventional in the representation of semiconductor devices, it will be appreciated that the various drawings are riot drawn to scale from one figure to another nor inside a given figure, in particular that the layer thickness are arbitrarily drawn for facilitating the reading of the drawings.

FIRST EMBODIMENT

Figure 1A:
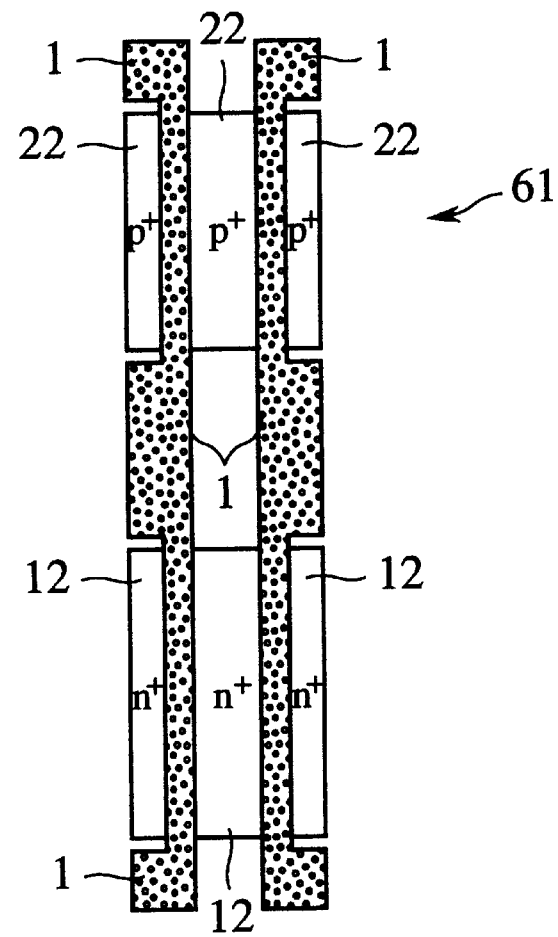
Figure 2A:
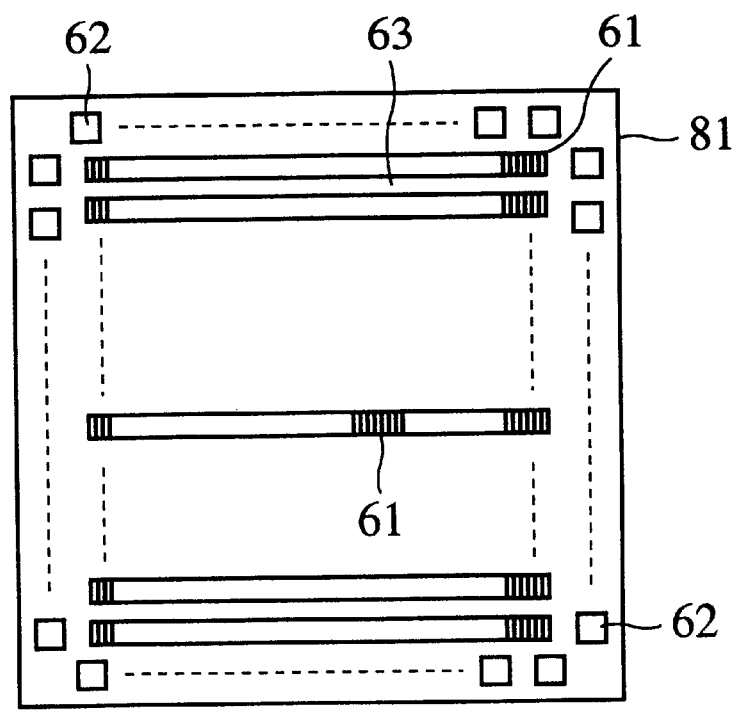
FIGS. 2A and 2B are a schematic plan view illustrating an overall configuration of a master chip fabricated by a gate array architecture.
Figure 2B:
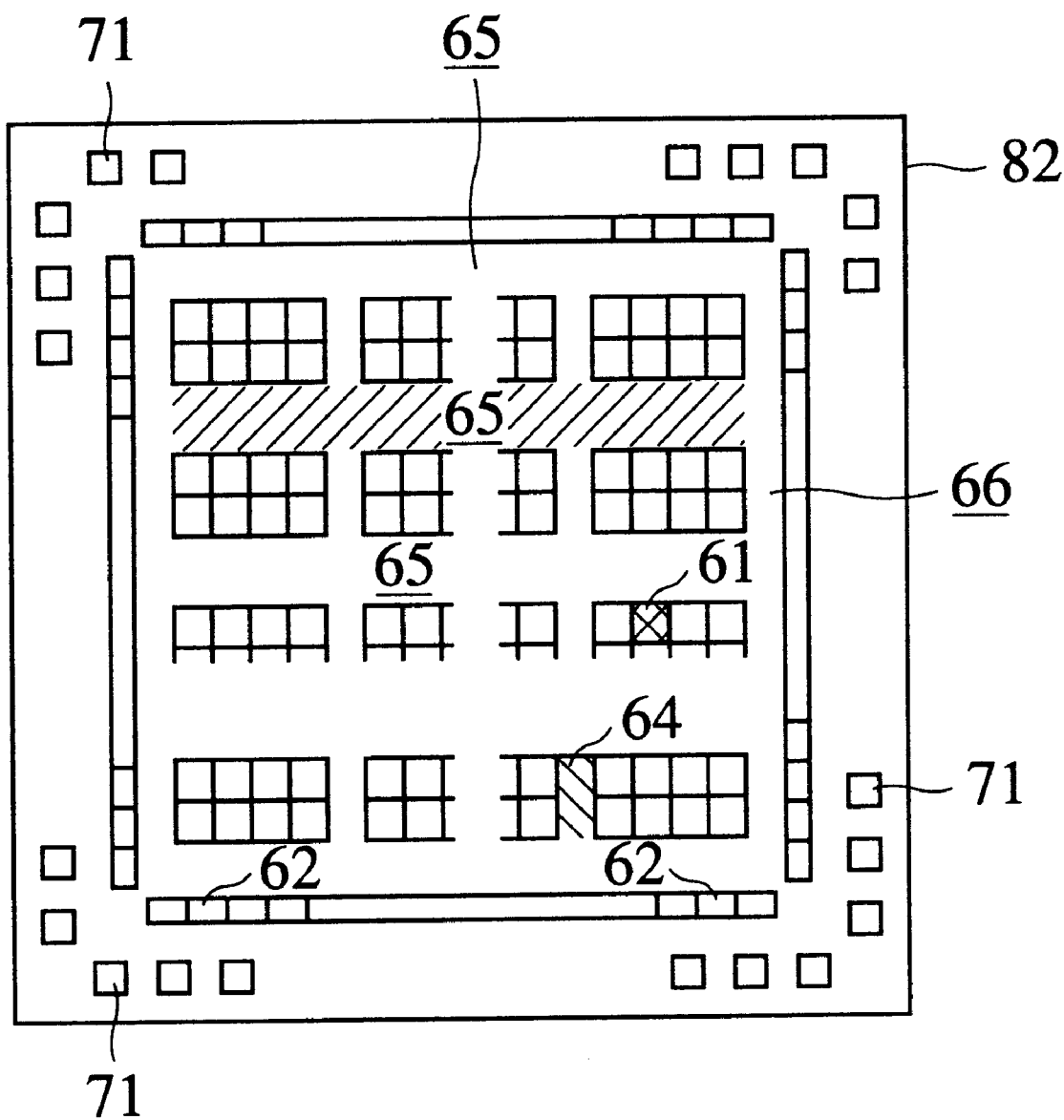
Figure 3A:
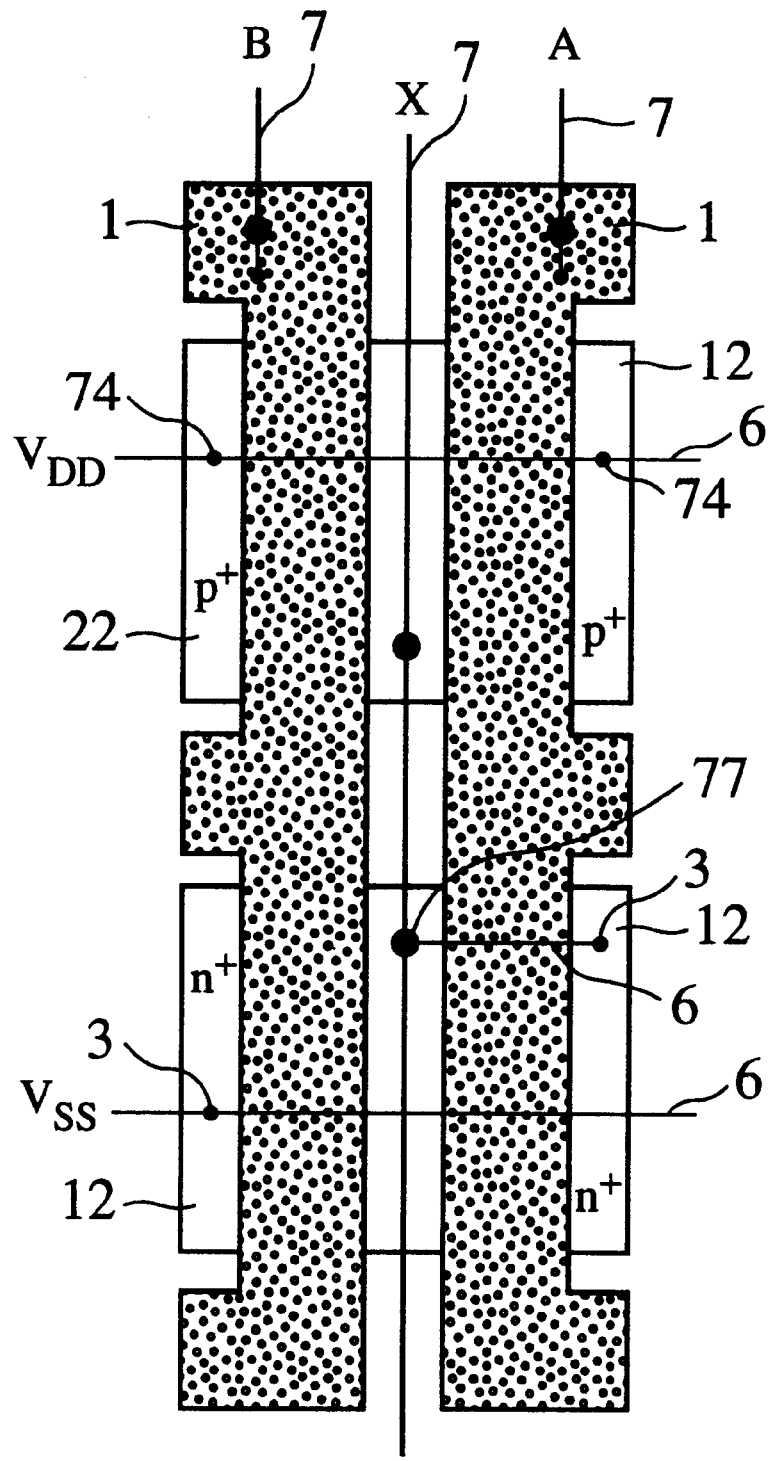
FIG. 3A is a schematic illustration of a gate array design methodology where a two-input NAND gate is configured by forming a first and a second wiring layers above the basic cell.
Figure 3B:
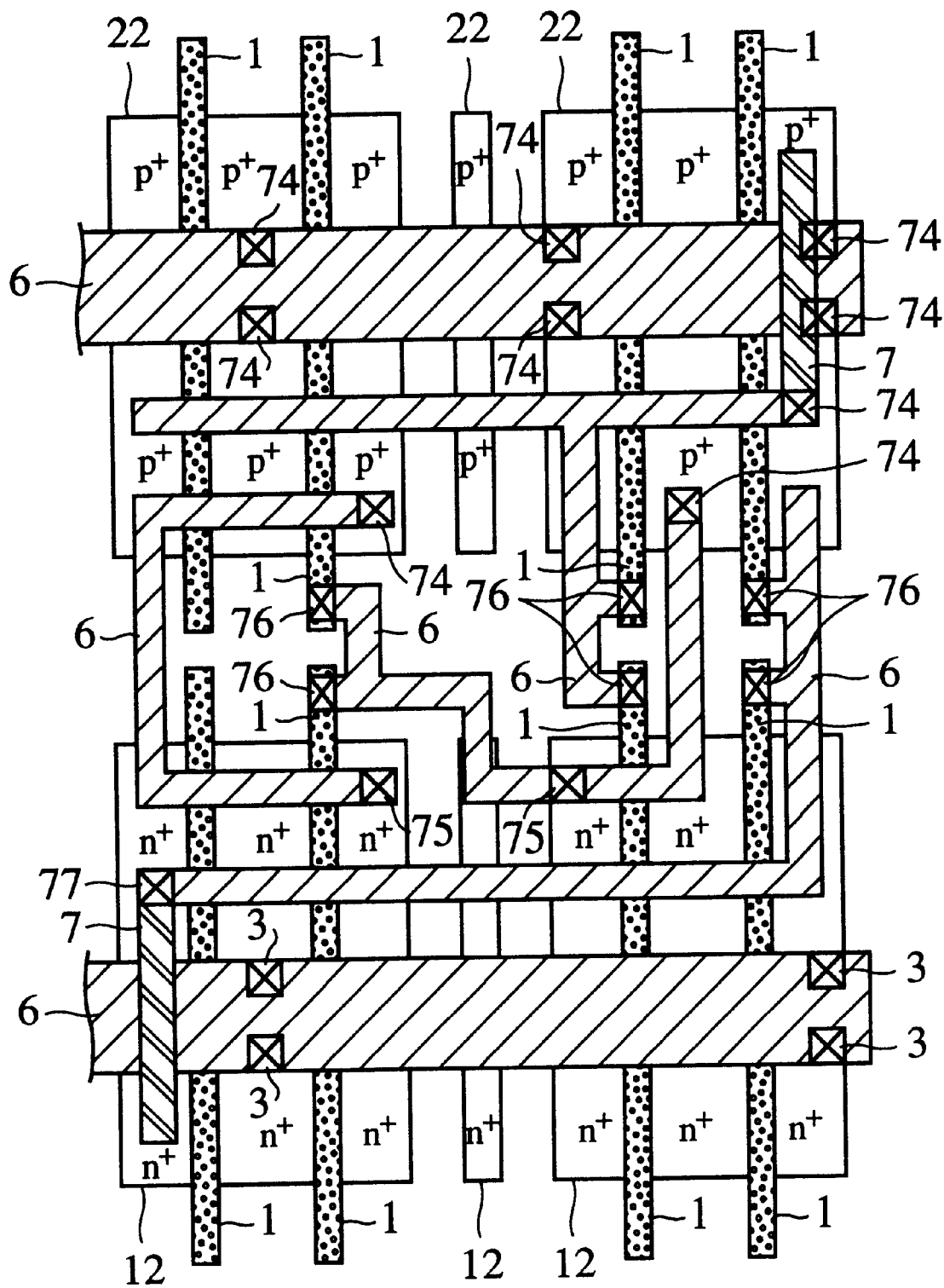
FIG. 3B is a plan view more specifically illustrating patterns of a first and a second level interconnections of another two-input AND gate customized by the gate array architecture.
Figure 4A:
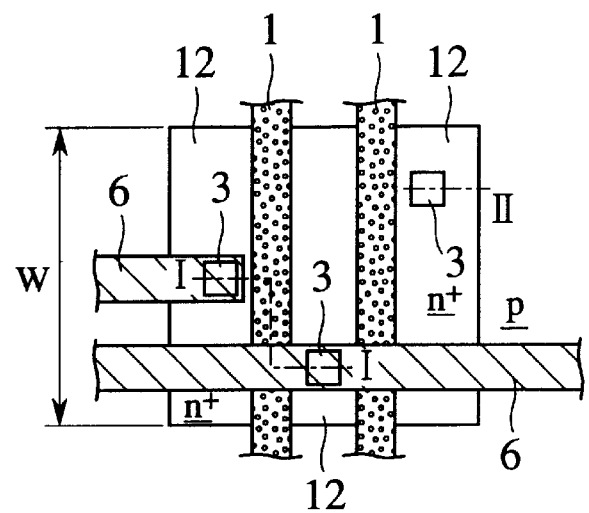
Figure 4B:
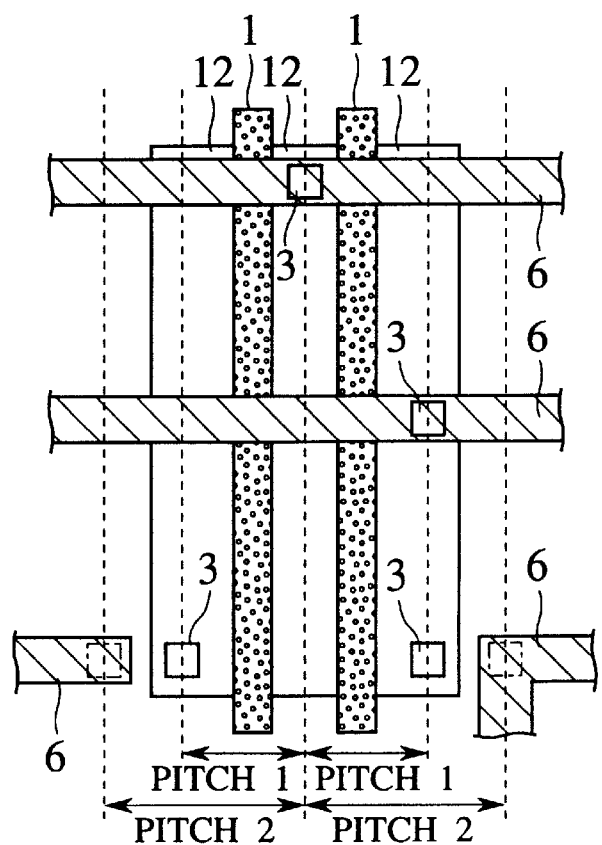
FIG. 4B is a plan view illustrating a case where the pitch is different between a basic cell pattern and a metal wiring layer pattern.
Figure 5A:
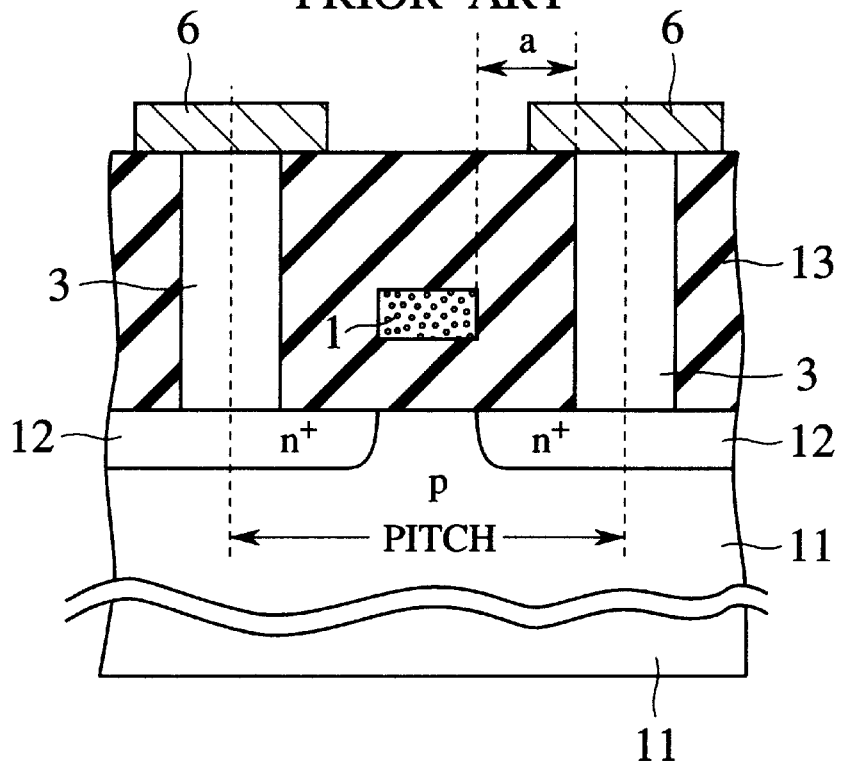
Figure 5B:
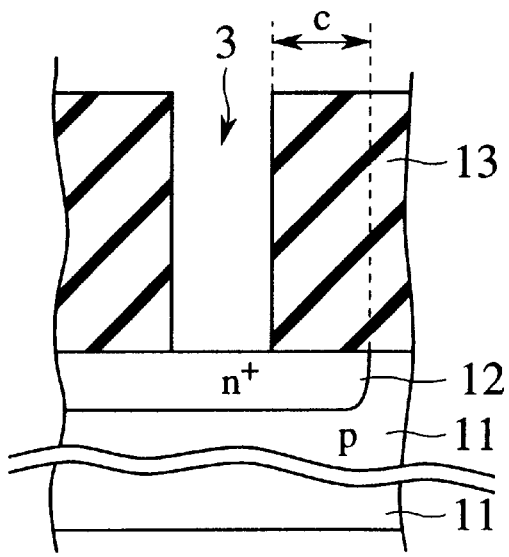
FIG. 5B is a cross sectional view cut along the II—II line of FIG. 4A.
Figure 7A:
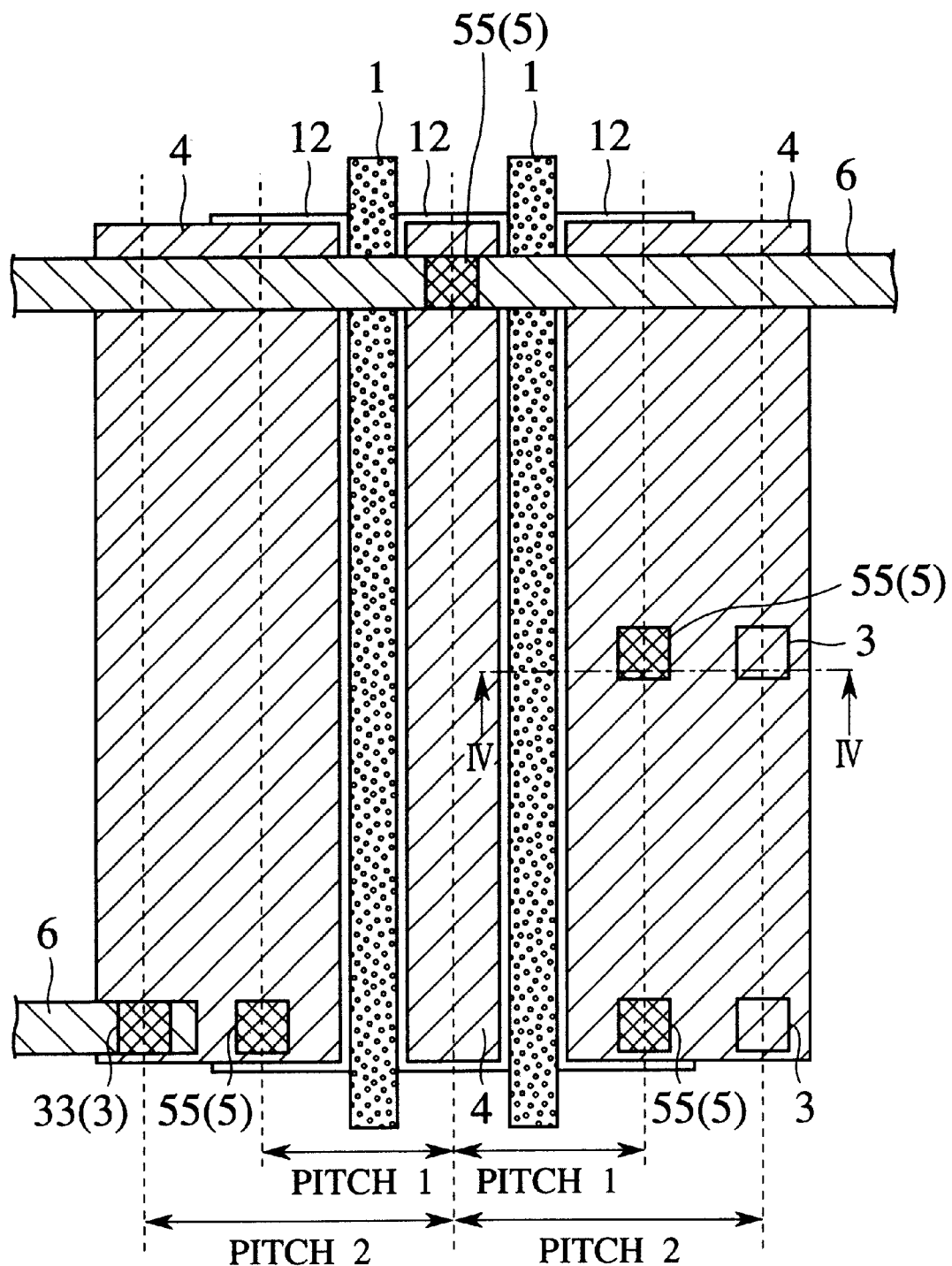
FIG. 7A is a plan view of an ASIC basic cell related to a first embodiment of the present invention.
Figure 7B:
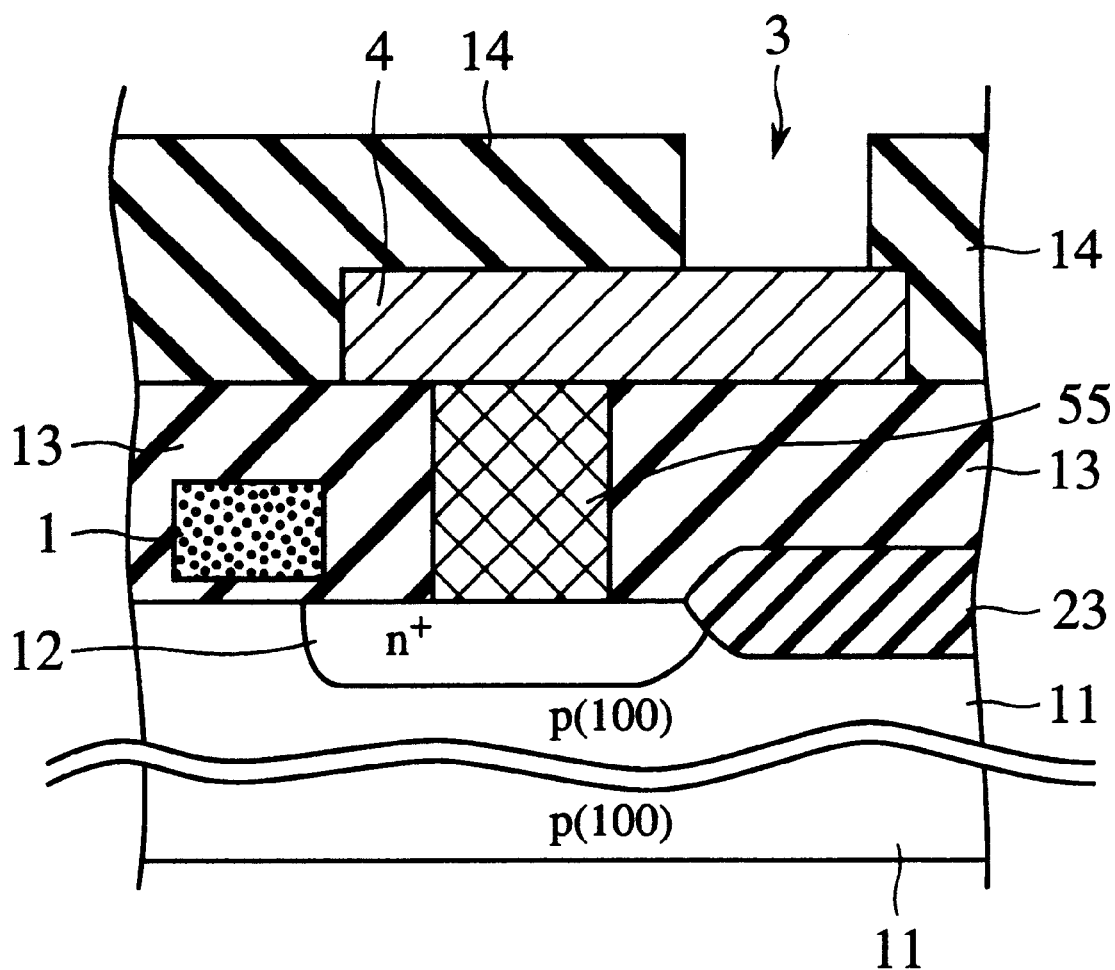
FIG. 7B is a fragmentary cross sectional view cut along the IV—IV line of FIG.7A.

FIG. 7A is a plan view of an application specific integrated circuit (ASIC) related to a first embodiment of the present inventions while FIG. 7B is a cross sectional view cut along the V—V line of FIG. 7A. In a first embodiment of the present invention, instead of directly opening contact holes in an inter-layer insulator film above source/drain regions of basic cells constituting a gate array in the conventional ASIC to interconnect the source/drain regions and the first level interconnection via those contact holes, as shown in FIG. 7B, joint contacts (first contact holes) 5 are opened in a first inter-layer insulator film 13 to form joint plugs 55 made of tungsten (W), tungsten silicide ($WSi_2$), or polysilicon in the joint contacts. A joint plate or "wing" 4 made of W, $WSi_2$, or polysilicon is formed so as to be connected to those joint plugs 55, to open second contact holes 3 in a second inter-layer insulator film formed above the wing 4. Therefore, via those second contact holes 3, a first level interconnection 6 and the wing 4 are interconnected; more specifically, as shown in FIG. 8H, via prescribed plugs 33, the first level interconnection 6 and the wing 4 are electrically connected. The first level interconnection corresponds to a deepest metal wiring layer of the conventional ASIC, being formed of Al, Al—Si, W, $WSi_2$, polysilicon, or other high-conductivity film. The wing 4, on the other hand, is locally placed only above and in the vicinity of source/drain regions 12 constituting a basic cell as shown in FIG. 7A. The first level interconnection 6 in an ASIC, on the other hand, is a metal wiring layer, extending up to the outside of the basic cell, for example to wiring channel regions 63, 65, and 66 shown in FIGS. 2A and 2B, so that the wing by the present invention can be clearly discriminated from this first level interconnection 6. The wing 4 and the joint plugs 55 can be integrated into one entity made of the same conductive material.

In the first embodiment of the present invention, as shown in FIG. 7A, joint contacts 5 are arranged in a basic cell with a prescribed small first pitch (pitch 1) as shown in FIG. 7A, so that the overlying first level interconnection is routed with second pitch (pitch 2) larger than the first pitch (pitch 1) in such a way that the first level interconnection 6 is placed above prescribed grids. Then, the wing 4 is formed where it overlaps with joint contacts 5. The wing 4 serves as "virtual source/drain region". And contact holes (second contact holes) are opened for interconnection between the first level interconnection 6 and wing 4.

According to a structure shown in FIGS. 7A and 7B, even if a user customizes such a pattern design that the second pitch (pitch 2) of the first level interconnection 6 of the metal wiring layers is enlarged, it is not necessary to change (re-design) the patterns of the prefabricated basic cell. With this, the pattern re-design does not require enlargement of the source/drain regions. Therefore, there are no problems of increases in parasitic source-drain resistance caused by increased resistivity of the source-drain region or increases in junction capacitance acting as parasitic capacitance accompanied by unnecessary increases in the source/drain regions. Although FIGS. 7A and 7B show part of an nMOS FET as a basic cell, the conductivity type can of course be reversed to provide a pMOS FET. A PMOS FET can be formed on an n-type substrate. Or an n-well can also be formed in a p-type substrate to form the PMOS FET in the n-type well. Conversely, a p-type well can be formed in an n-type substrate to form an nMOS FET therein. Moreover, a twin-well structure comprising both a p-type well and an n-type well can be provided in which a CMOS is configured by an nMOS FET and a PMOS FET formed in the respective wells, and also they can be combined with a bipolar device to provide a BiCMOS-configured basic cell, which can be easily understood from the spirit of the present invention.

Figure 8A:
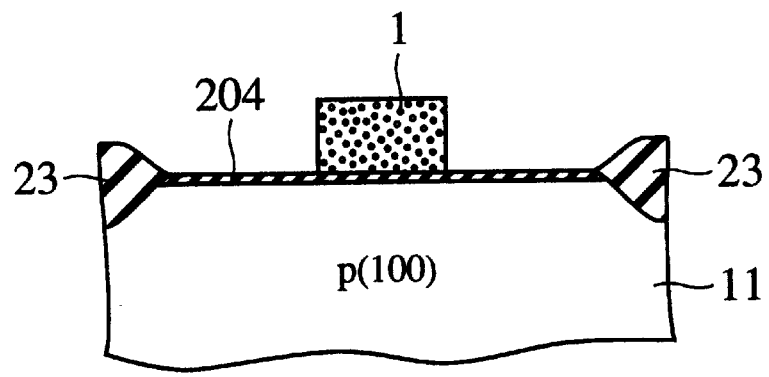
FIGS. 8A through 8C are process views showing the prefabrication steps for ASIC basic cells related to the first embodiment of the present invention.
Figure 8B:
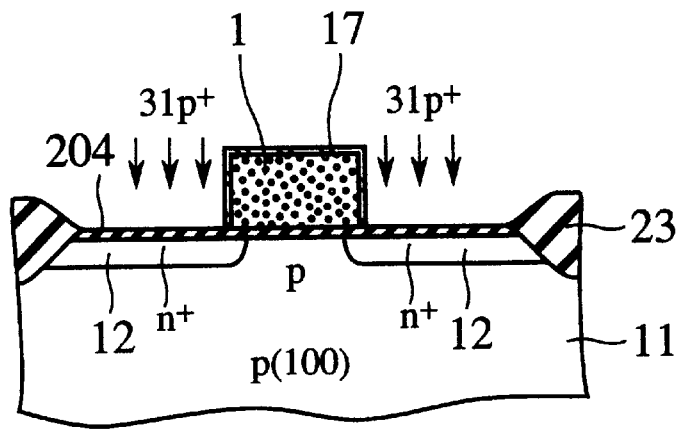
Figure 8C:
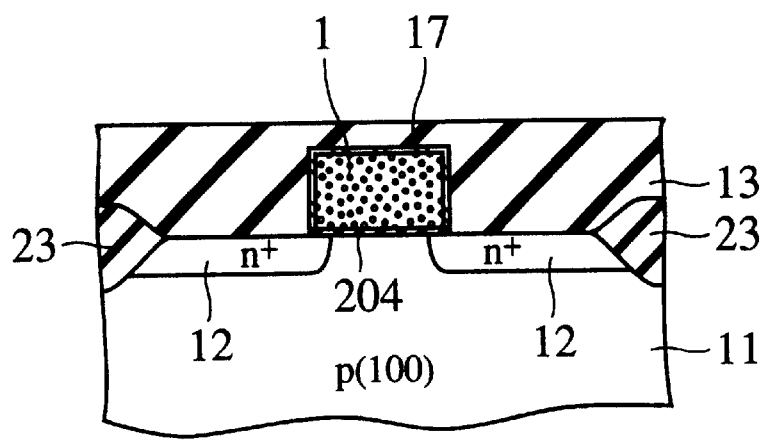
Figure 8D:
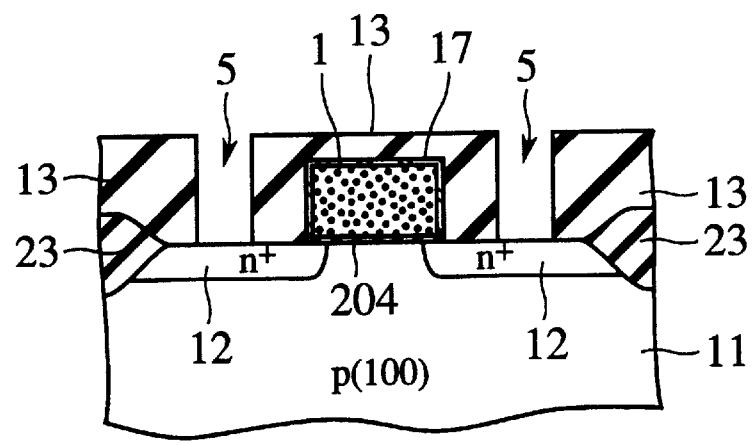
FIGS. 8D through 8H are process views showing a customizing method of forming ASIC metal wiring layers related to the first embodiment of the present invention.
Figure 8E:
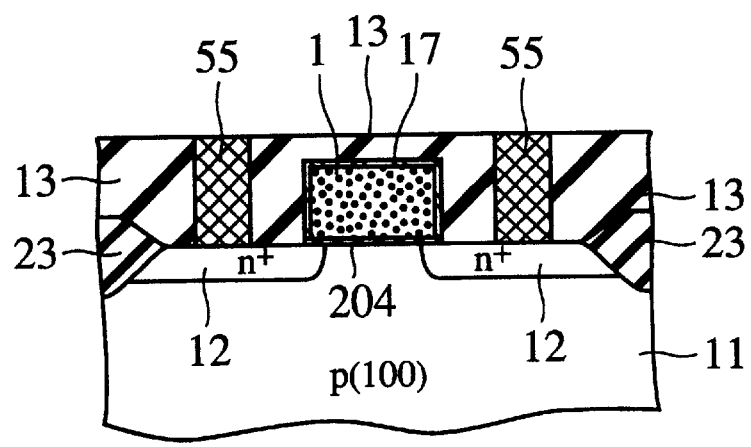
Figure 8F:
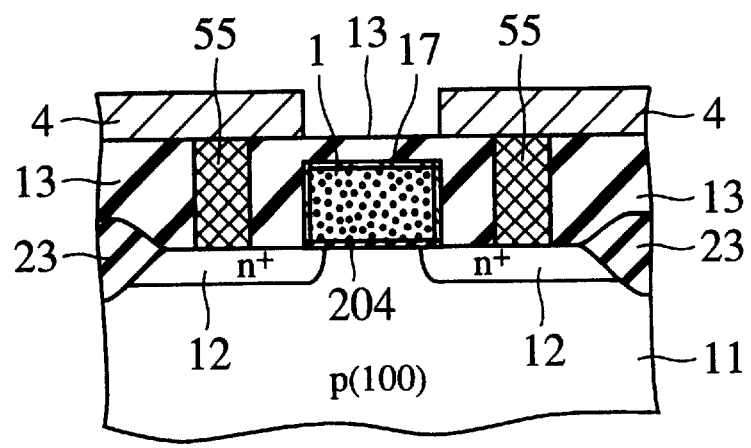
Figure 8G:
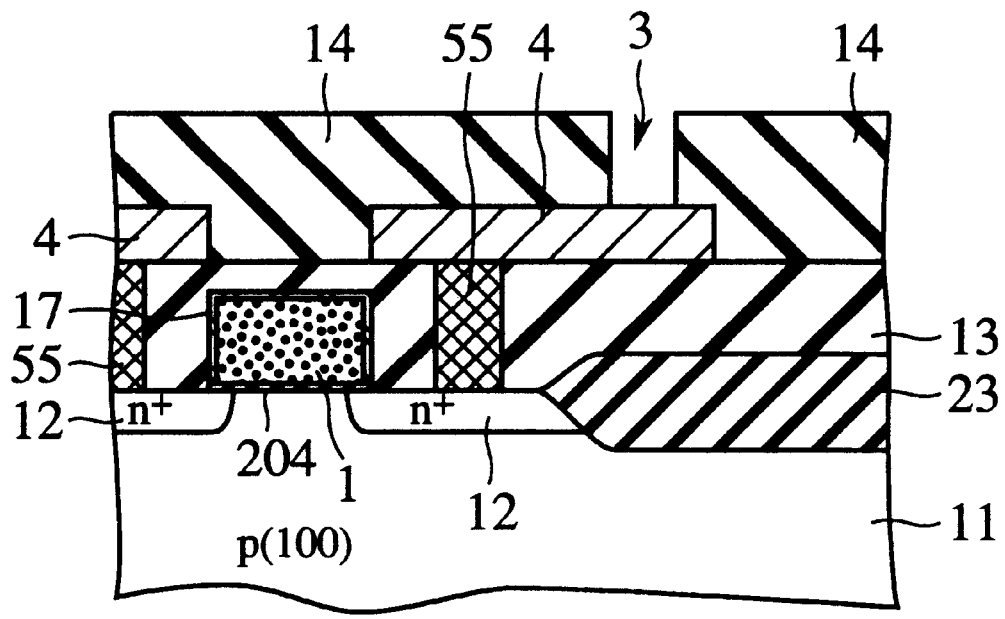
Figure 8H:
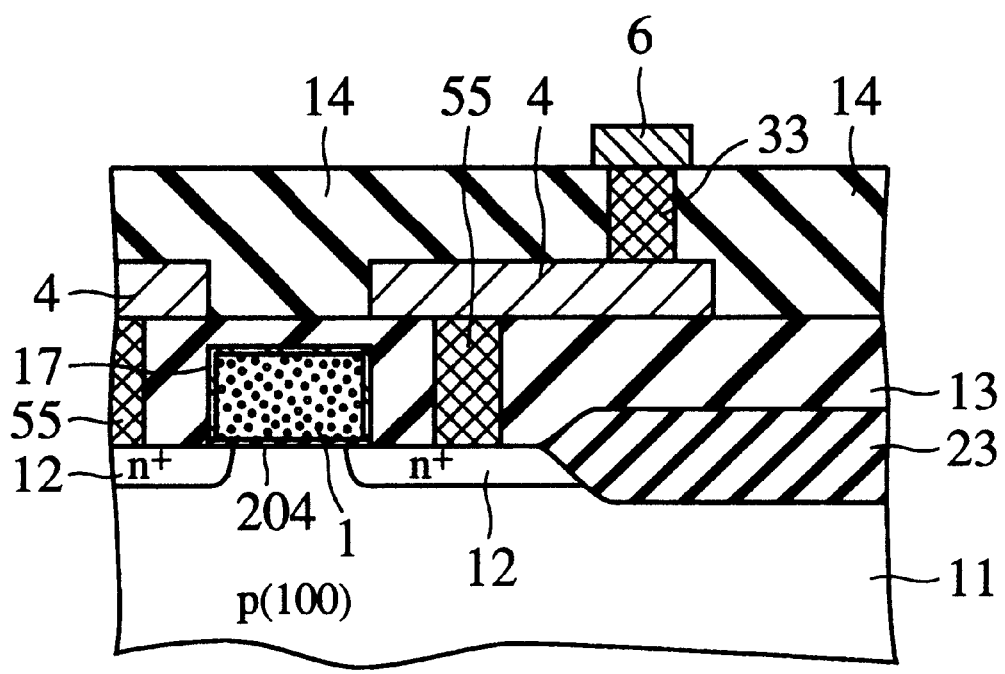

A semiconductor circuit related to the first embodiment of the present invention can be fabricated by the processes shown in FIGS. 8A through 8H. FIGS. 8A through 8C are views of processes showing a method of prefabricating a basic-cell part, while FIGS. 8D through 8H are views of processes of customizing a metal wiring layer above this basic cell.

BASIC CELL FABRICATION (PREFABRICATION)

(a) First, a p(100) substrate 11 with an impurity concentration of $5 \times 10^{15}$ to $3 \times 10^{17}$ cm$^{-3}$ is prepared beforehand, to selectively form an $Si_3N_4$ film using a prescribed mask pattern. By a local oxidation method such as LOCOS by use of this $Si_3N_4$ film, a device-isolation oxide film (field oxide film) 23 is formed to a thickness of 0.3 to 1.0 micrometer as shown in FIG. 8A, to electrically isolate devices adjacent each other. If higher integration density is required, it is preferable to employ a prescribed mask pattern to form trenches in the p(100) substrate 11 by using the RIE method, so that those trenches are embedded with an insulator by the BOX method (Buried OXide method), the STI method (Shallow Trench Isolation method), or other insulation method. (Note here that as a starting material, an n(100) substrate may be prepared to form a device-isolation oxide film 23, and then $^{11}B^+$ ions are implanted and driven-in to form a p-type well, thus forming a semiconductor region equivalent to a p-type substrate.) Then, in the surface of the p(100) substrate 11, a gate oxide film 204 is formed to a thickness of 10 to 30 nm, to deposit phosphorus-doped polysilicon 1 to a thickness of 300 nm by the CVD method. Thus, the photolithography method using the first mask pattern and the etching process using the RIE method are performed to form gate electrode 1 with a gate length of 0.5 micrometer as shown in FIG. 8A.

(b) After an post-oxide film 17 is formed to a thickness of 10 nm, a second mask pattern is used to implant ions of $^{31}P^+$ with an acceleration energy of Vac=30 keV and a dosage $\Phi = 3 \times 10^{15}$ cm$^{-2}$. Next, annealing is performed for 30 minutes at a temperature of 850 degrees to form an n$^+$ source/drain region 12 as shown in FIG. 8B. In FIG. 8B, the field oxide film 23 acts as the second mask, so that it is not necessary to perform photolithography by using of the second mask pattern additionally. In this case, a mask pattern used for device insulation, i.e. a pattern to selectively form the $Si_3N_4$ film or a pattern to form trenches corresponds to the second mask pattern.

(c) An inter-layer insulator film 13 consisting of an $SiO_2$ film with a thickness of 300 to 500 nm or a composite film comprising $SiO_2$, PSG, and BPSG films is deposited by use of the CVD method etc. Then, the surface of the inter-layer insulator film 13 is flattened by the chemical mechanical polishing (CMP) method etc. to complete a basic cell as shown in FIG. 8C.

A substrate thus prefabricated by those processes will be prepared in the gate array fabrication methodology.

CUSTOMIZATION

Next, in the gate array fabrication methodology according to the present invention, based on the user demands, contact holes, via holes and metal wiring patterns of various specifications are designed above this basic cell, to customize the metal wiring layers by the following processes:

(d) in an inter-layer insulator film 13 which acts as the top layer of the basic cell, first contact holes (joint contacts) 5 are opened using a third mask pattern as shown in FIG. 8D. The joint contacts 5 are placed with the pitch 1 as shown in FIG. 7A. The joint contacts 5 can be opened by etching the inter-layer insulator film 13 by the RIE method etc.

(e) Next, into those joint contacts 5 is embedded polysilicon (doped polysilicon) in which P, As, Sb or other n-type impurity doped, W or other refractory metal, or silicide made of $WSi_2$ or other refractory metal as shown in FIG. 8E, to provide joint plugs (first plugs) 55. The first plugs 55 may be embedded by the selective CVD method or may also be deposited throughout the surface and then be remained only inside the joint contacts 5 by the CMP method.

(f) The electron-beam (EB) evaporation method, DC magnetron-sputtering method, or CVD method is used to deposit W, Ti, Mo, $WSi_2$, $TiSi_2$, $MoSi_2$, or doped polysilicon, which is then patterned into wings 4 using a fourth mask pattern as shown in FIG. 8F. This patterning employs a known photolithography method and the RIE method, so that the wings 4 may be formed where it overlaps with the first contact holes 5 so as to be connected to the first plugs 55.

(g) Above the wings 4, a second inter-layer insulator film 14 consisting of an $SiO_2$, PSG, BPSG, or $Si_3N_4$ film or a composite film of those films is deposited by the CVD method. Next, in this inter-layer insulator film 14 are opened second contact holes 3 using a fifth mask pattern, as shown in FIG. 8G, where the film 14 overlaps with the wings 4. The second contact holes 3 are opened with a pitch 2 as shown in FIG. 7A.

(h) Into the second contact holes 3 are formed second plugs 33 made of W, Ti, Mo, $WSi_2$, or doped polysilicon. The EB evaporation method, sputtering method, or CVD method is used to deposit a layer of a high-conductivity material such as Al, Al—Si, W, or doped polysilicon, to form a first level interconnection 6 using a sixth mask pattern as shown in FIG. 8H, to customize a gate array related to the first embodiment of the present invention. The first level interconnection 6 extends perpendicular to the surface of FIG. 8.

Figure 1B:
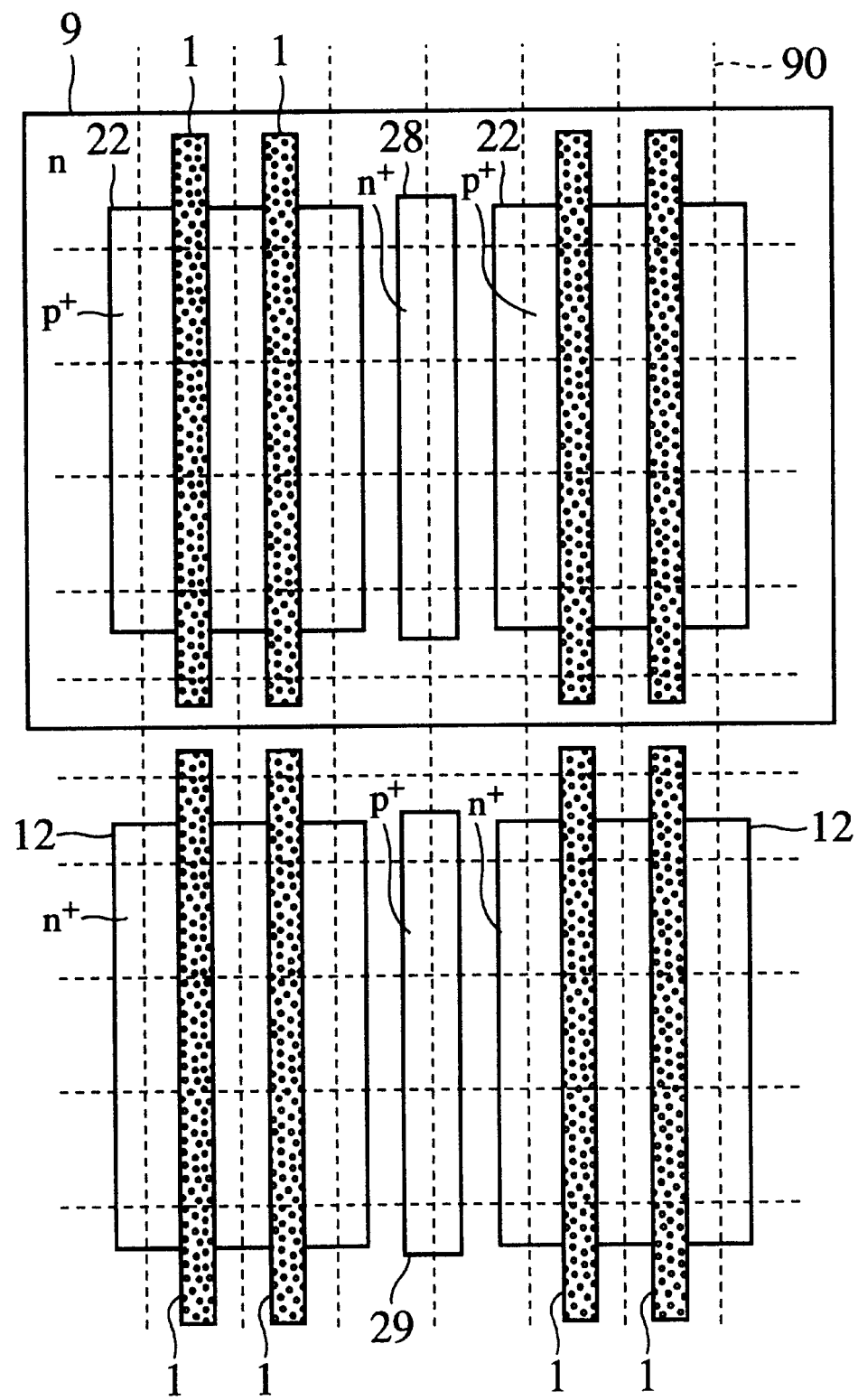
FIG. 1B is a schematic plan view where grids are placed above the basic cells.
Figure 9:
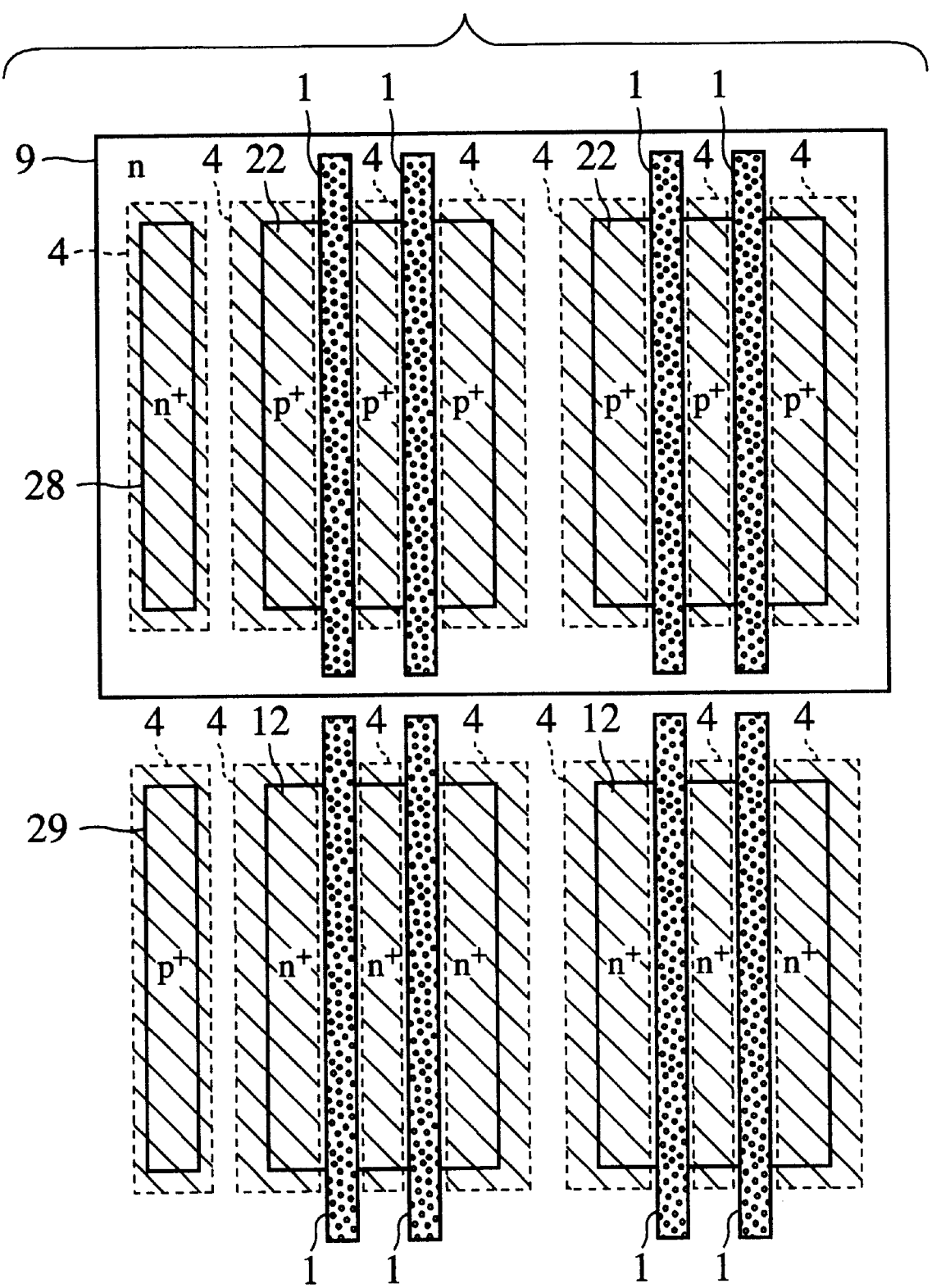
FIG. 9 shows a range of "wings" according to the present invention.

FIG. 9 shows a range of the wings 4 of gate arrays related to the first embodiment of the present invention. In FIG. 9, an n-type well is formed in a p-type substrate, in which n-type well 9 are formed p$^+$ regions 22 which act as source/drain regions and n$^+$ contact regions 28 for the n-type well. Within the p-type substrate outside of n-type well 9, n$^+$ regions 12 are formed as source/drain regions, in the vicinity of which are formed p$^+$ contact regions 29 for the p-type substrate. Above each of the n$^+$ regions 12 and the p$^+$ regions 22 are placed each two gate polysilicon 1 to configure the basic cell. As shown in FIG. 9, the wings 4 are locally placed above and the vicinity of the source/drain regions 12 and 22 respectively, where the wing above one of the source/drain region cannot extends over the adjacent source/drain region as a rule. That is, measured with automatic wiring grids as shown in FIG. 1B, "the wing 4" by the present invention is defined as a joint plate placed only in a range that extends beyond the source/drain region by at most one to two grids.

Figure 10:
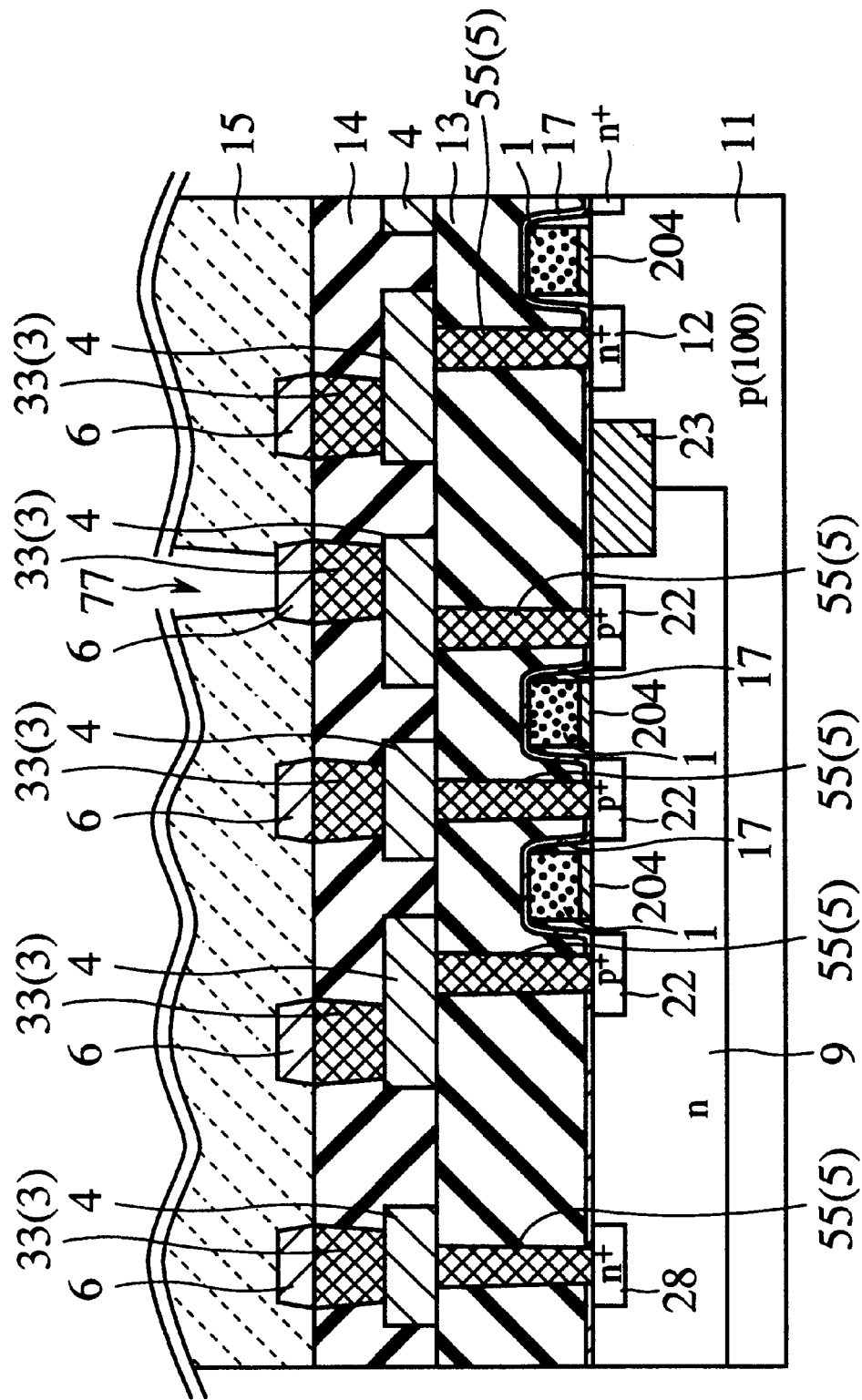
FIG. 10 is a cross sectional view of an ASIC related to a modification of the first embodiment of the present invention.

FIG. 10 is a cross sectional view of a modification of an ASIC related to the first embodiment of the present invention. In FIG. 10, an n-type well 9 is formed in a p(100) substrate 11, in which devices are isolated from each other by a field oxide 23 formed by the BOX method. In the n-type well, $p^+$ regions 12 which act as source/drain regions are formed. Above the n-type well 9 which acts as channel regions between the source and drain regions is formed a gate oxide film 204. In the n-type well 9, moreover, are formed $n^+$ contact regions 28. And in the p-type substrate 11, $p^+$ type contact regions are formed which are not shown. On both sides of the gate polysilicon are formed side walls, above which is formed post-oxide film 17. Above the post-oxide film 17 is formed the first inter-layer insulator film 13 consisting of $SiO_2$, PSG, or BPSG films or a composite film made of those films, to configure the basic cell.

In the gate array architecture, metal wiring layers such as a first and a second level interconnections are customized on this basic cell. In a modification of the first embodiment shown in FIG. 10, however, the source/drain regions 12 and 22 are interconnected with the first level interconnection 6 in the basic cell with joint contacts and wings 4. That is, as shown in FIG. 10, in the first inter-layer insulator film 13 are formed joint contacts 5 which act as the first contact holes that expose the surface of the source/drain regions 12 and 22 and also the $n^+$ contact regions 28 (as well as $p^+$ contact regions not shown). Into those joint contacts 5 are embedded the first plugs 55 made of polysilicon, W, or other high-conductivity materials, to form the wings 4 so as to be connected to the first plugs 55. The wings 4, in a surface pattern, are a joint plate made of polysilicon, W, $WSi_2$, $TiSi_2$, or other high-conductivity material positioned in the vicinity of the source/drain regions 12 and 22, $n^+$ contact regions 28, etc. as shown with reference to FIG. 9. Above the wings 4 is formed an inter-layer insulator film 14 made of $SiO_2$, PSG, BPSG, or a composite film of those films, in second inter-layer insulator film 14 are formed second contact holes 3 so as to expose part of the wing 4. Into the second contact holes 3 are embedded second plugs 33 made of polysilicon, W, Ti, Mo, $WSi_2$, $TiSi_2$, or other high-conductivity materials. So as to be in contact with the second plug 33, the first level interconnection 6 of gate array is formed, extending perpendicular to the surface of the drawing. Above the first level interconnection 6 is formed a third inter-layer insulator film 15 made of $SiO_2$, PSG, BPSG, $Si_3N_4$, etc., in which are provided via holes 77. Above the third inter-layer insulator film 15 is provided a second level interconnection not shown. The via holes 77 connect the second level interconnection and the first level interconnection 6. In the via holes 77, prescribed plugs may be embedded. If the via holes 77 are shallow, however, the second level interconnection may be in direct contact with the first level interconnection. Actually, the third level interconnection may be formed above the second level interconnection, although overlying wiring layers above the third level are omitted here. Of course, a semiconductor device may has the second level interconnection as the top layer. The wing 4 and the joint plugs 55 may be formed simultaneously with the same silicon, W, or other high-conductivity materials. Likewise, the second plugs 33 and the first level interconnection 6 may be formed simultaneously with the same high-conductivity materials. In such a case, the wing 4 and the first plugs 55 or the first level interconnection 6 and the second plugs 33 may make the same material region respectively. According to the present invention, however, irrespective of whether the wing 4 and the first plugs 55 are integrated or not and also whether the first level interconnection 6 and the second plugs 33 are integrated or not, the part of the high-conductivity material embedded into the first contact holes is called "the first plug", and the part of the high-conductivity material embedded into the second contact holes is called "the second plug".

SECOND EMBODIMENT

Figure 11A:
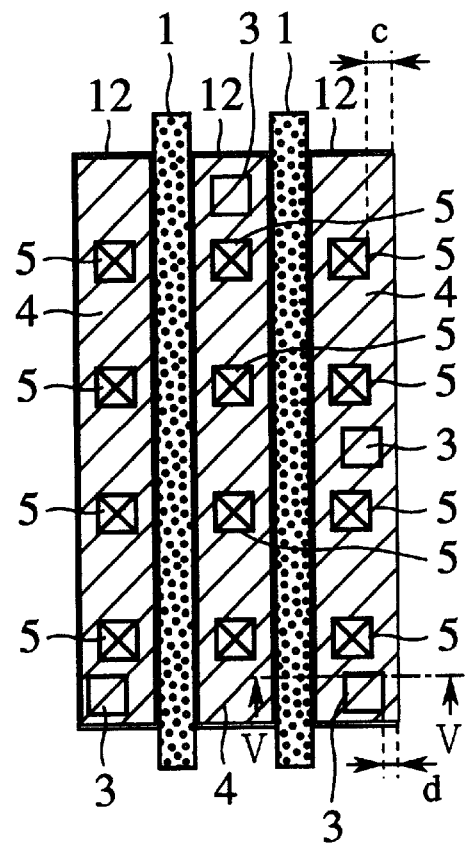
Figure 11B:
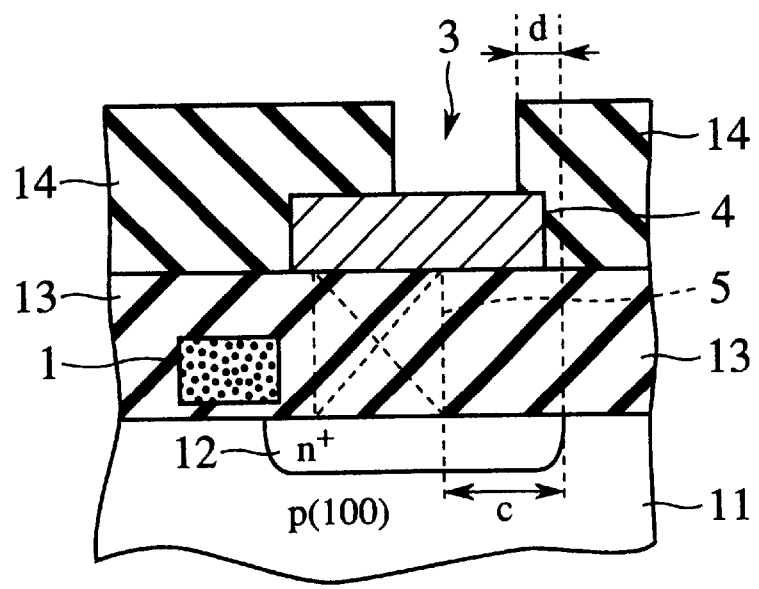
FIG. 11B is a fragmentary cross sectional view cut along the V—V line of FIG. 11A.

FIG. 11A is a plan view showing a part of application specific integrated circuit (ASIC) related to a second embodiment of the present invention, while FIG. 11B is a cross sectional view cut along the V—V line of FIG. 11A. As in the case of the first embodiment, a second pitch (pitch 2) of a first Level interconnection constituting a metal wiring layer in a gate array is larger than a first pitch (pitch 1) of contact holes (first contact holes) in a basic cell.

In the second embodiment of the present invention, as shown in FIGs. 11A and 11B, the pitch 1 is employed to arrange the first contact holes (joint contacts) 5 in the basic cell, while the pitch 2 is employed to arrange the second contact holes 3 as against a first level interconnection. The first and second contact holes are interconnected with wings 4.

In the designing of gate array patterns, such a prescribed grid as shown in FIG. 1B is defined beforehand, at whose intersections are automatically arranged the square-shape patterned contact holes having a prescribed area registered in the database. By using this database, as many first contact holes (joint contact holes) 5 as possible are arranged at the pitch-1 positions of the grids so that "a margin c" between the outer edge of the first contact hole within the basic cell's source/drain regions 12 in a mask-alignment plane and the edge of the source/drain regions 12 can be secured. Further, in this mask-alignment plane, the patterns are arranged so that a constant distance between the edge of the gate polysilicon 1 and the the inner edge of the first contact hole 5 is guaranteed. "The inner edge" here refers to either side of the contact hole 5 whichever nearer to the gate polysilicon 1. "The outer edge" here refers to either side of the contact hole 5 whichever more distant from the gate polysilicon 1. The first level interconnection is placed on the basis of the pitch 2, arranging the second contact holes 3 at the intersections of the grids with the pitch 2. The wing 4 is formed where the second contact holes 3, first contact holes (joint contacts) 5, and source/drain regions 12 overlap with each other in the mask-alignment plane. With this, the wing 4 can be viewed as a "virtual source/drain region". Therefore, the first contact holes 5 can be arranged at prescribed grid intersections without limited by the positions of the first level interconnection, thus enabling pattern design without changing the automatic wiring database stored in the computer. That is, without re-designing the source/drain regions 12 or resultant increases in the area of those regions, MOS FETs can be easily customized. Also, by providing as many joint contacts 5 as possible, a substantial area of contacts can be increased, thus enabling decreasing the contact resistance (the ohmic resistance). By providing as many joint contacts 5 as possible, moreover, the diffusion resistance as measured along the longitudinal direction of the gate polysilicon can be decreased, thus decreasing the parasitic resistance. With this, the second embodiment realizes high-speed, low-power consumption ASICs.

THIRD EMBODIMENT

Figure 12A:
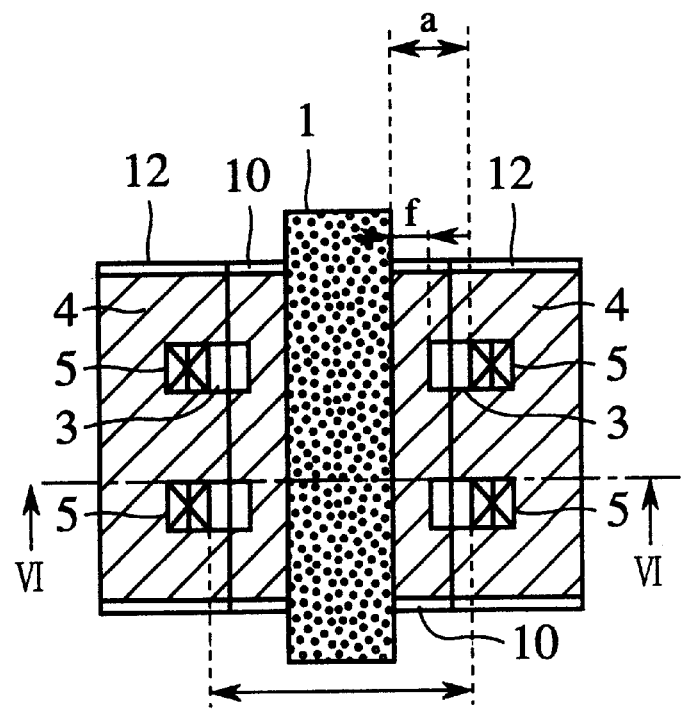
Figure 12B:
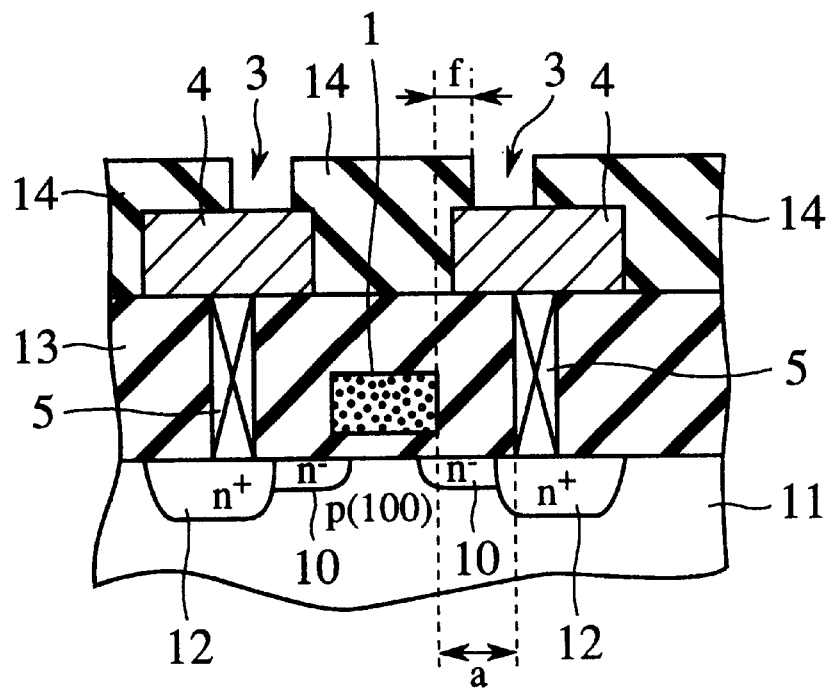
FIG. 12B is a cross sectional view cut along the VI—VI line of FIG. 12A.

FIG. 12A is a plan view showing a part of an application specific integrated circuit (ASIC) related to a third embodiment of the present invention, while FIG. 12B is a cross sectional view cut along the VI—VI line of FIG. 12A. The third embodiment of the present invention related to such a case that the second pitch (the pitch 2) of the first level interconnection is smaller than the first pitch (the pitch 1) of first contact holes 5. In the case of such an LDD-MOS FET as shown in FIG. 12B, for example, the third embodiment relates to the wiring patterns of gate array where a distance between the first contact hole and the gate polysilicon 1 is larger than a pitch of wirings of a basic cell using normal MOS FETs. Of course, the normal MOS FETs can be used instead of LDD-MOS FETs. For example, this holds true even with a case where there is a matching problem between a pitch of the bit line/word line and that of logics when hybridizing memories and logics on the same chip. The first pitch (the pitch 1) and the second pitch (the pitch 2) are relative, so that the third embodiment can apply to any cases as far as the pitch 1 is larger than the pitch 2.

Here, the following described about, for example, a gate array related to the third embodiment of the present invention that a 0.2 to 1.9 micrometer depth of $n^+$ source/drain regions 12 with a high-impurity concentration of $5\times10^{18}$ to $1\times10^{21}$ cm$^{-3}$ and a shallow, 0.05 to 0.2 micrometer $n^-$ source/drain regions 10 with a low-impurity concentration of $5\times10^{14}$ to $1\times10^{18}$ cm$^{-3}$ are included in an LDD-type nMOS FET of the basic cell. In an LDD-MOS FET shown in FIG. 12B, a distance between the $n^+$ source/drain region 12 and the gate polysilicon is larger than the usual nMOS-FETs to inhibit the short-channel effects or to increase the breakdown voltage or to decrease the gate parasitic capacitance. According to the third embodiment of the present invention, within the area which acts as the inside of the $n^+$ source/drain regions 12 of the basic cell, the first contact holes (joint contacts) 5 are positioned and opened in the first inter-layer insulator film 13. The wings (joint plates) 4, which overlap with the joint contacts 5, are patterned and arranged in the vicinity of the $n^+$ source/drain regions 12. Above the wing 4 is formed the second inter-layer insulator film 14, in which second contact holes 3 are opened at the position where they overlap with the wings 4 in a mask-alignment plane, in such a configuration that the first level interconnection, corresponding to the metal wiring layer of the conventional gate arrays, may be connected to the wings 4.

Figure 6A:
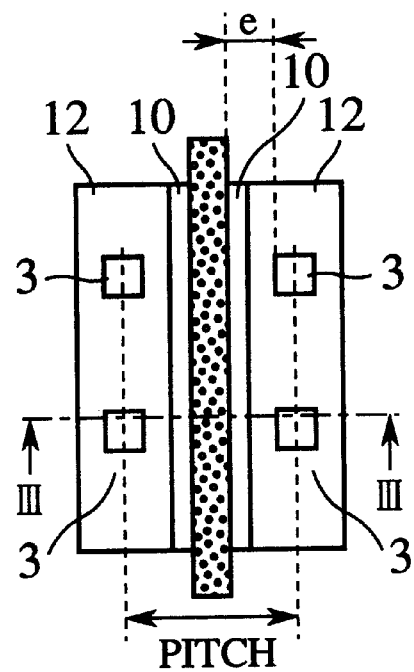
Figure 6B:
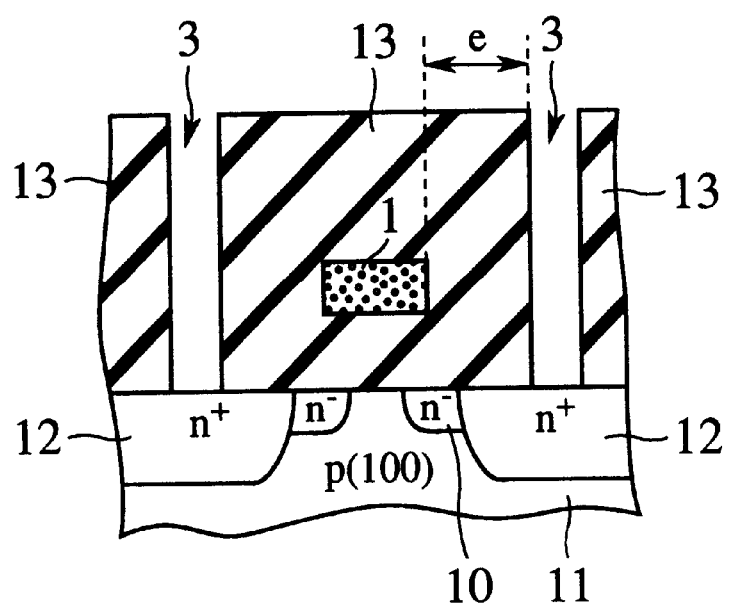
FIG. 6B is a cross sectional view cut along the III—III line of FIG. 6A.

By a structure shown in FIGS. 12A and 12B, it is possible to design basic cells without being limited by the design rules of the metal wiring layers. That is, "a distance a" between the inner edge of the first contact hole 5 and the gate polysilicon 1 can be enlarged so that a constant margin can be secured between the outer edge of the first contact hole 5 and the edge of the source/drain regions 12, where the joint contacts 5 can be placed. Also, as against the first level interconnection, second contact holes which match a routing pitch of the first level interconnection can be placed. A wing 4 is formed in such a region that overlaps with the second contact holes 3 and also with the joint contacts 5. With this, the wing 4 may be viewed as a "virtual source/drain region". Therefore, it is not necessary to take into account the distance between the inner edge of the second contact holes 3 and the gate polysilicon 1, so that the second contact holes 3 can be placed with "an interval f" which is smaller than "the distance (mask-alignment margin) e" between the inner edge of the contact hole and the edge of the gate polysilicon in an LDD-MOS FET shown in FIGS. 6A and 6B. With this, the second pitch of the first level interconnection can be decreased independently of width of the gate polysilicon (gate length) or the pitch between the gates.

Thus, according to the third embodiment of the present invention, independently of the first pitch of the first contact holes 5, the second pitch of the first level interconnection (pitch 2) and also that of upper level interconnections than the second level can be designed. Therefore, gate arrays can be realized which has higher breakdown voltage and a higher integration density. Also, the design rules of the basic cells can be standardized and the pitch of the first level interconnection can be decreased, to provide finer design rules of the basic cells. That is, by further decreasing the pitch of the first level interconnection, the pitch of the second level interconnection and overlying ones can also be decreased, thus making it possible to easily increase integration densities and hybridize memories and logics as well as analog and digital circuits in the same ASIC.

Note here that the third embodiment of the present invention is not limited to the LDD-MOS FETs, but can be applied to various basic cells in such a situation that "a distance (mask-alignment margin) a" between the inner edge of the first contact holes 5 in direct contact with the source/drain regions 12 and the edge of the gate polysilicon (gate electrode) 1 has to be increased due to the user demands.

Various modifications will become possible to those skilled in the art after receiving the teachings of the present disclosure without departing from the scope thereof.

What is claimed is:

1. An application specific integrated circuit comprising:
   a plurality of basic cells, each comprising source and drain regions;
   a first level interconnection of metal layers formed above the basic cells;
   first contact holes formed on said source and drain regions in order to provide electrical connection against said source and drain regions; and
   second contact holes formed under and in direct contact with said first level interconnection to form electrical paths through said first contact holes to said first level interconnection,
   wherein a first pitch of said first contact holes is different from a second pitch of said second contact holes.

2. The integrated circuit of claim 1, wherein said first pitch is smaller than said second pitch.

3. The integrated circuit of claim 1, wherein said first pitch is larger than said second pitch.

4. An application specific integrated circuit having a plurality of basic cells and metal layers formed above the basic cells, wherein a first pitch of first contact holes formed on source and drain regions which constitute said plurality of basic cells in order to provide electrical connection against said source and drain regions is different from a second pitch of second contact holes in direct contact with a first level interconnection of the metal layers,
   wherein said first pitch is larger than said second pitch.

5. An application specific integrated circuit comprising:
   a plurality of basic cells, each comprising source and drain regions;
   a first level interconnection of metal layers disposed above the basic cells;

first contact holes formed on said source and drain regions to provide electrical connection against said source and drain regions;

second contact holes in direct contact with said first level interconnection; and wings arranged above said basic cells and only in the vicinity of said source and drain regions so as to interconnect said first and second contact holes mutually.

6. The integrated circuit of claim 5, wherein said first pitch is smaller than said second pitch.

7. An application specific integrated circuit having a plurality of basic cells and metal layers formed above the basic cells, wherein a first pitch of first contact holes formed on source and drain regions which constitute said plurality of basic cells in order to provide electrical connection against said source and drain regions is different from a second pitch of second contact holes in direct contact with a first level interconnection of the metal layers, wherein the number of said first contact holes is larger than that of said second contact holes in prescribed source or drain regions.

8. An application specific integrated circuit comprising:

(a) a plurality of basic cells having a part including a first-conductivity type semiconductor region provided on a prescribed substrate, a second-conductivity type source and drain regions formed on a part above said semiconductor region, a gate oxide film above said semiconductor region between said source and drain regions, a gate electrode above said gate oxide film, and a first inter-layer insulator film formed above said source and drain regions and said gate electrode;

(b) a plurality of first contact holes which are arranged on said substrate with reference to the position of intersections of grids having a first pitch and which are opened in said first inter-layer insulator film above source and drain regions of said plurality of basic cells;

(c) first plugs made of a high-conductivity material embedded into said first contact holes, respectively;

(d) wings which are electrically connected to said first plug and which are locally placed only in the vicinity of said said source and drain regions;

(e) a second inter-layer insulator film formed above said wings and said first inter-layer insulation film; and (f) a plurality of second contact holes which are formed in said second inter-layer insulation film above said wings and which are arranged with reference to the position of intersections of grids having a second pitch.

9. The integrated circuit of claim 8, wherein said first pitch is different from said second pitch.

10. The integrated circuit of claim 8, further comprising:

second plugs made of a high-conductivity material embedded into said second contact holes, respectively; and a first level interconnection electrically connected to said wing via said second plug.

11. The integrated circuit of claim 8, wherein a mask-alignment margin between the edge of said gate electrode and the edge of said first contact hole is larger than a mask-alignment margin between the edge of said gate electrode and the edge of said second contact hole.

12. The integrated circuit of claim 8, wherein a mask-alignment margin between the edge of said source and drain regions and the edge of said first contact hole is larger than a mask-alignment margin between the edge of said source and drain regions and the edge of said second contact hole.

13. The integrated circuit of claim 8, wherein the number of said first and second contact holes are equal to each other in prescribed source and drain regions.

14. The integrated circuit of claim 8, wherein the number of said first contact holes is larger than the number of said second contact holes in prescribed source and drain regions.

15. An application specific integrated circuit comprising a plurality of basic cells and metal layers formed above the basic cells, wherein a first pitch of first contact holes formed on source and drain regions which constitute said plurality of basic cells in order to provide electrical connection against said source and drain regions is different from a second pitch of second contact holes formed above the basic cells and in direct contact with a first level interconnection of the metal layers.

* * * * *